United States Patent
Matsuo et al.

(10) Patent No.: US 7,599,460 B2
(45) Date of Patent: Oct. 6, 2009

(54) TRANSMITTING APPARATUS

(75) Inventors: Hiroyuki Matsuo, Kadoma (JP); Eiji Maeda, Neyagawa (JP)

(73) Assignee: Fujitsu Limited, Kawasaki (JP)

( * ) Notice: Subject to any disclaimer, the term of this patent is extended or adjusted under 35 U.S.C. 154(b) by 506 days.

(21) Appl. No.: 11/400,337

(22) Filed: Apr. 7, 2006

(65) Prior Publication Data

US 2007/0079163 A1    Apr. 5, 2007

(30) Foreign Application Priority Data

Sep. 3, 2005    (JP) ............................... 2005-289129

(51) Int. Cl.
*H04L 7/00*    (2006.01)
(52) U.S. Cl. ...................................... 375/373; 375/376
(58) Field of Classification Search ................. 375/371, 375/373, 376, 295
See application file for complete search history.

(56) References Cited

U.S. PATENT DOCUMENTS 6,934,306 B1 *    8/2005    Park ........................... 370/517

FOREIGN PATENT DOCUMENTS

| JP | 61-270938 | 12/1986 |
| JP | 3-38128 | 2/1991 |
| JP | 5-2438 | 1/1993 |
| JP | 10-240375 | 9/1998 |

* cited by examiner

*Primary Examiner*—David B Lugo
(74) *Attorney, Agent, or Firm*—Katten Muchin Rosenman LLP

(57) ABSTRACT

A device including a line interface for additionally installing a line is installed in a terminal repeater device which takes a work and protection redundancy configuration based on a criterion such as SONET, SDH, or the like. Within the device additionally installed, the clocks supplied from work and protection devices are each compared. The respective clocks are variably delayed based on the comparison result so as to allow the device additionally installed to perform clock phase control as to the work and protection lines.

5 Claims, 14 Drawing Sheets

TRANSMITTING APPARATUS

BACKGROUND OF THE INVENTION

1. Field of the Invention

The present invention applies to transmitting apparatus (terminal repeater devices) having a redundant configuration of work and protection lines based on a standard such as a synchronous optical network (SONET), synchronous digital hierarchy (SDH), or the like.

2. Description of the Related Art

Transmitting apparatus (i.e. Optical terminal repeater devices, Optical terminals/transmitting devices, Add/Drop Multiplexer) are increased line capacity by expansion units that including work and protection line.

FIG. 1 illustrates the configuration of an optical terminal in which expansion units accommodating work and protection lines are provided. An optical terminal 1 comprises a main unit 100, and expansion units 90 and 91, and the main unit and the expansion units are configured of separate shelves.

The main unit 100 comprises a work-line setting unit 30, a protection-line setting unit 30', interface units 71, 72, 73, and 74, a work-timing-clock generating unit 96, and a protection-timing-clock generating unit 96'.

The interface units 71 and 73 are connected to work lines 4 and 4'.

The interface units 72 and 74 are connected to protection lines 6 and 6'.

The interface units 71, 72, 73, and 74 are connected to the work-line setting unit 30 and the protection-line setting unit 30'.

The work-line setting unit 30 and the protection-line setting unit 30' perform line settings based on the overhead information of the signals received from receiving devices 10, 11, 12, and 13 within the interface units 71, 72, 73, and 74. Further, the work-line setting unit 30 and the protection-line setting unit 30' output the signal based on the line settings to transmitting devices 20, 21, 22, and 23 within the interface units 71, 72, 73, and 74.

The transmitting devices 20 and 21 output a light signal to the work lines 4 and 4', and the transmitting devices 22 and 23 output a light signal to each of the protection lines 6 and 6'.

The work-line setting unit 30 and the protection-line setting unit 30' include a work clock unit 95 and a protection clock unit 95'.

The work clock unit 95 includes a circuit-changing switch 61, and a PLL circuit 65.

The PLL circuit 65 comprises a phase comparator 62, a loop-back filter 63, and a voltage-controlled oscillator 64.

The circuit-changing switch 61 selects a clock from the work-timing-clock generating unit 96 or the protection-timing-clock generating unit 96', and outputs this to a phase comparator 62.

The phase comparator 62 compares the clock selected by the circuit-changing switch 61 with the clock from the voltage-controlled oscillator 64, and outputs the comparison result to the loop filter 63.

The loop filter 63 converts the input from the phase comparator 62 into a voltage value, and outputs this to the voltage-controlled oscillator 64.

The voltage-controlled oscillator 64 supplies a clock signal to a bus-interface unit 80 and the phase comparator 62.

The bus-interface unit 80 performs transmitting/receiving a signal as to the interface units 71 through 74 in accordance with the line setting, and the expansion units 90 and 90', and also supplies a clock signal to the expansion units 90 and 90'.

The protection-line setting unit 30' has the same configuration as the work-line setting unit 30, so the same configurations are appended with a dash on the same numbers thereof, and the descriptions thereof are omitted.

The expansion unit 90 comprises a work-line setting unit 31, a protection-line setting unit 31', interface units 71', 72', 73', and 74', an intra-expansion-unit work-timing-clock generating unit 97, and an intra-expansion-unit protection-timing-clock generating unit 97'.

The interface units 71' and 73' are connected to work lines 5 and 5'.

The interface units 72' and 74' are connected to protection lines 7 and 7'.

The interface units 71', 72', 73', and 74' are connected to the work-line setting unit 31 and the protection-line setting unit 31'.

The work-line setting unit 31 and the protection-line setting unit 31' transmit the signals received from receiving devices 10', 11', 12', and 13' within the interface units 71', 72', 73', and 74' to bus-interface units 80 and 80' through bus-interface units 82 and 82' respectively.

Further, the work-line setting unit 31 and the protection-line setting unit 31' output the signals transmitted from the bus-interface units 80 and 80' through the bus-interface units 82 and 82' respectively to transmitting devices 20', 21', 22', and 23' within the interface units 71', 72', 73', and 74' in accordance with the line setting.

The transmitting devices 20' and 21' output a light signal to the work lines 5 and 5', and the transmitting devices 22' and 23' output a light signal to the protection lines 7 and 7' respectively.

The work-line setting unit 31 and the protection-line setting unit 31' include an intra-line-setting-unit work-clock unit 98 and an intra-line-setting-unit protection-clock unit 98'.

The intra-line-setting-unit work-clock unit 98 comprises a delay line 67, a selecting circuit 68, and a PLL circuit 66.

The clock signal received from the bus-interface unit 82 is input to the each of delay line 67 and the selecting circuit 68.

The selecting circuit 68 selects from the output of the delay line 67 and the output of the bus-interface unit 82, and outputs this to an intra-expansion-unit work-timing-clock generating unit 97 and an intra-expansion-unit protection-timing-clock generating unit 97'.

The delay line 67 sets the amount of retardation based on the steady phase difference from the work timing clock generating unit to the circuit within the expansion unit, which is generated by the entire system.

This amount of retardation is based on the retardation due to the connection between the main shelf accommodating the mounting parts serving as components of the mounting board, and pattern length of the mounting board, the main unit of the optical terminal, and the shelf accommodating the expansion unit.

That is to say, in the event of employing such a device configuration, the delay line 67 of the shelf on the expansion-unit side is for absorbing the phase difference (skew) between the work and protection clock signals which is caused due to mounting pattern length difference, and the solid-state irregularity of the respective mounting parts in the clock route up to the shelf on the expansion-unit side with the work-timing-clock generating unit 96 and the protection-timing-clock generating unit 96' within the shelf on the main-unit side as the starting point.

The PLL circuit 66 is a circuit for supplying a clock signal to the work-line setting unit 31, and is for synchronizing an internal clock with the clock from the bus-interface unit 82.

The intra-expansion-unit work-timing-clock generating unit 97 includes a switching unit 94, selects the clock from the intra-line-setting-unit work clock unit 98 and the intra-line-setting-unit protection clock unit 98' within the work-line setting unit 31 and the protection-line setting unit 31', and supplies this clock to the interface units 71' through 74'.

The intra-expansion-unit protection-timing-clock generating unit 97' includes a switching unit 94', selects the clock from the intra-line-setting-unit work clock unit 98 and the intra-line-setting-unit protection clock unit 98' within the work-line setting unit 31 and the protection-line setting unit 31', and supplies this clock to the interface units 71' through 74'.

Known means for performing the phase synchronization between multiple clock signals include the means disclosed in Japanese Unexamined Patent Application Publication No. 05-2438, and the means disclosed in Japanese Unexamined Patent Application Publication No. 10-240375.

With the related art, it has been necessary for steady phase difference to be generated between the work and protection-timing-clock generating units, and the intra-expansion-unit work and protection-timing-clock generating units needs to be determined beforehand.

That is to say, it has been necessary to determine the amount of retardation of the delay line using the mounting parts and pattern length of the mounting board serving as components in the main unit and expansion unit thereof Accordingly, with the related art, modifying the system design thereof needs to be performed while maintaining the correlation between the mounting parts and the pattern length on the mounting board, which has provided a problem wherein flexible handling thereof cannot be performed, or the modifiable range thereof is limited.

Further, phase correction using a fixed delay line cannot correct the phase shift due to solid-state irregularity for each mounting part and the amount of propagation delay.

SUMMARY OF THE INVENTION

Accordingly, it is an object of the present invention to provide technology for automatically controlling the clock phase of the clock from the work and protection timing clock generating units provided in the main unit with the intra-expansion-unit work and protection timing clock generating units provided on the expansion-unit side, in the event that an expansion unit accommodating lines is additionally installed an optical terminal along with increase of circuit capacity.

The present invention employs the following configuration to achieve the above object.

That is to say, one aspect of the present invention is a transmitting device comprising a first device and a second device. The first device has a first clock source for generating a first clock, and a second clock source for generating a second clock. The second device has a first clock pull-in means, a second clock pull-in means, a first clock pull-in means for pull-in the first clock to the second clock, a phase comparison means and a phase control means. The second clock pull-in means pulls in the second clock to the first clock. The phase comparison means compares the phase of clock output of the first clock pull-in means with that of the second clock pull-in means. The phase control means controls the amount of phase control of the first clock pull-in means and the second clock pull-in means based on the result of the phase comparison means.

DESCRIPTION OF THE PREFERRED EMBODIMENTS

Description will be made below regarding the configuration of a transmitting device to which the present invention is applied.

The present invention relates to transmitting apparatus for SONET/SDH (also referred to as optical terminals or transmitting devices).

Optical terminals which support line redundancy have been known as network applications on the SONET/SDH optical transmission level (e.g., OC-N: OC-192/OC-48/OC-12, etc.).

As for network application configurations, the following configurations have been known.

(1) Point-to-point Configuration:

This configuration connects between optical terminals in a point-to-point manner, and switches between work and protection lines using a non-switch-back line protection method (1+1 line protection) and an automatic protection switch.

(2) Linear ADM Configuration:

This configuration is positioned in an intermediate station (repeater) on a link, performs route settings using an Add/Drop facility within the device, and realizes the same line redundancy as described above.

(3) UPSR (Uni-directional Path Switched Ring) Configuration:

This configuration is a two-fiber ring configuration, transmits the same signal to the path on the east side and the path on the west side, and selects a line having better quality using a path switch on the reception side (redundancy facility on a path level).

(4) Two Fiber Bi-directional Line Switched Ring (BLSR) Configuration:

In the event that a failure has occurred at the two fiber ring configuration, an automatic protection-line switching device (automatic protection switch: APS) performs loop back control for each line using an overhead byte, and realizes line relief by switching a signal to the protection line.

(5) 4F-BLSR Configuration:

This four fiber ring configuration performs line relief using the non-switch-back line protection method (1+1 line protection), and performs line relief at loop back operation for each line using APS-OH byte at the time of both work and protection lines being disconnected.

In order to realize the above network applications, the circuit of the optical terminal is configured of a redundancy configuration.

Hereinafter, description will be made regarding an embodiment of the present invention with reference to the drawings. The configurations of the embodiments are only exemplary, and the present invention is not restricted to the configurations of the embodiments.

Figure 1:
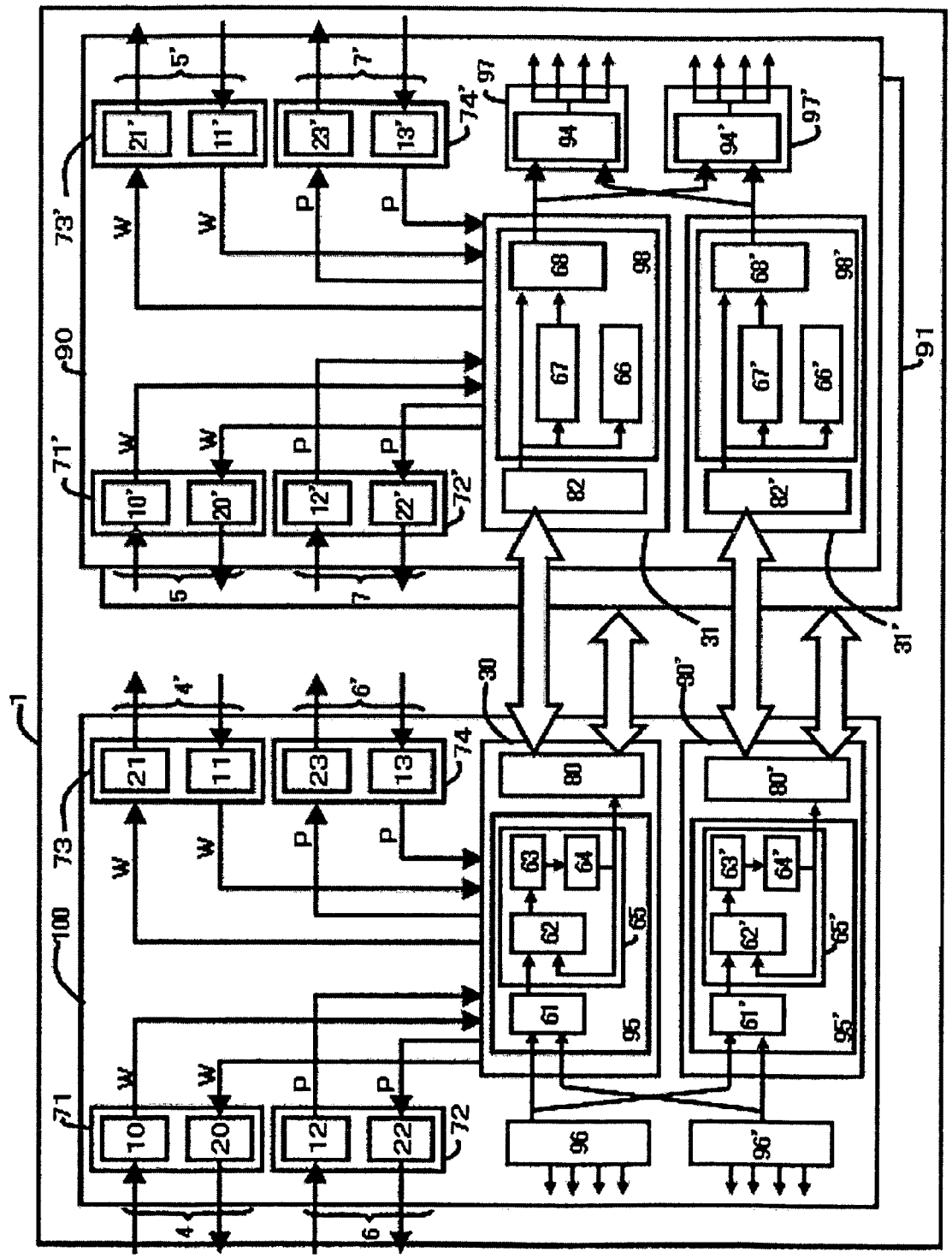
FIG. 1 is a diagram illustrating the configuration of an optical terminal which includes expansion units accommodating work and protection lines.
Figure 2:
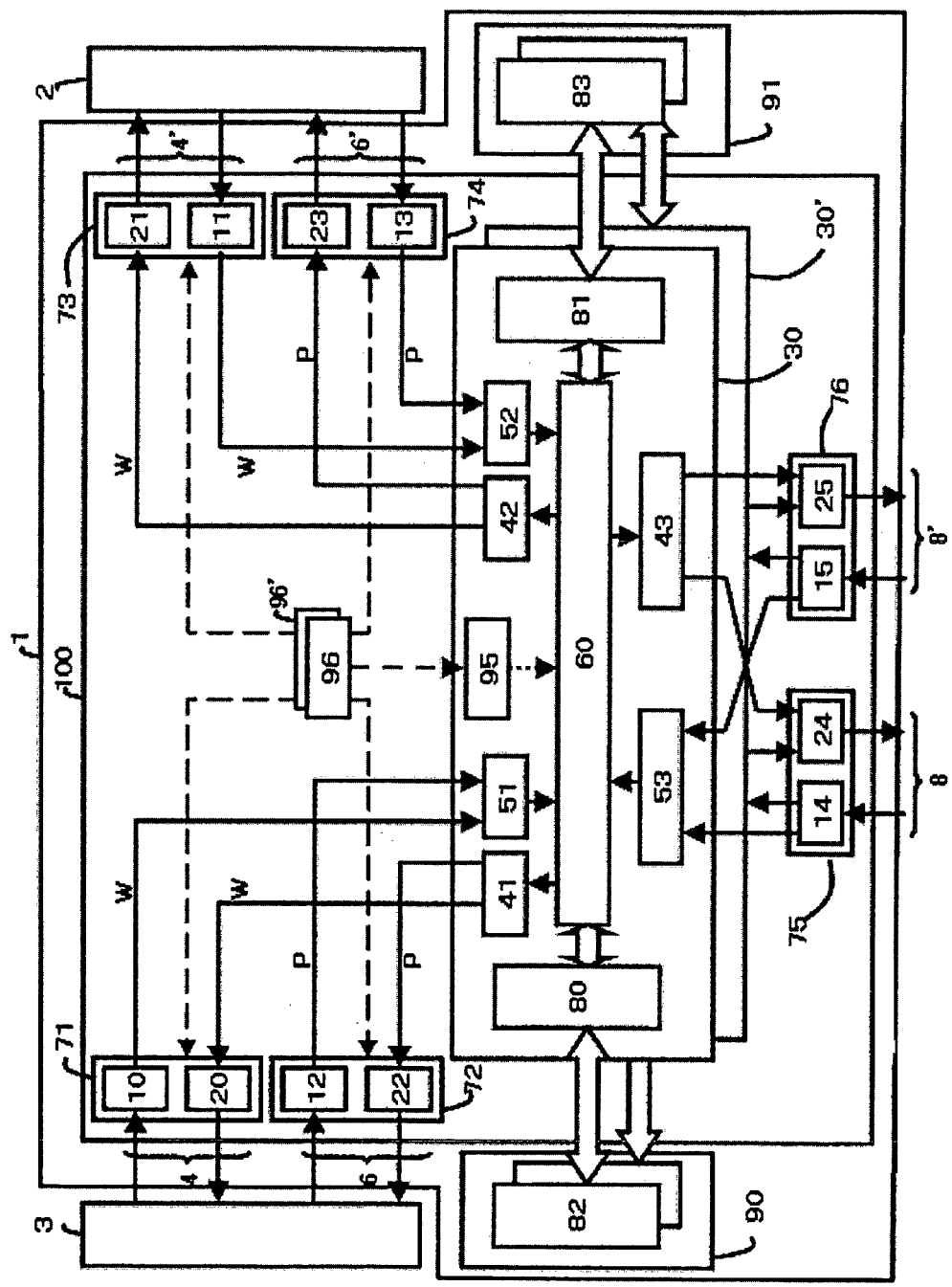
FIG. 2 is a diagram illustrating the configuration of the optical terminal.

FIG. 2 is a diagram illustrating the configuration of an optical terminal (transmitting device).

An optical terminal 1 is connected to optical terminals 2 and 3, work line 4 and 4' made up of up and down link, protection lines 6 and 6' made up of up and down link, and lines 8 and 8' for adding/dropping a signal.

The optical terminal 1 comprises a main unit 100, and expansion units 90 and 91, and the main unit and expansion units are configured in a separate shelf A main unit 100 comprises a work-line setting unit 30, a protection-line setting unit 30', interface units 71, 72, 73, 74, 75, and 76, a work-timing-clock generating unit 96, and a protection-timing-clock generating unit 96'.

The protection-line setting unit 30' has the same configuration as the work-line setting unit 30, so the description of the protection-line setting unit 30' is omitted by describing the work-line setting unit 30.

The protection-line-timing-clock generating unit 96' has the same configuration as the work-line-timing-clock generating unit 96, so the description of the protection-line-timing-clock generating unit 96' is omitted by describing the work-line-timing-clock generating unit 96.

Connection between the optical terminal 1 and the optical terminal 2 or 3 is performed through the interface units 71, 72, 73, and 74.

The interface units 71 and 73 are connected to the work lines 4 and 4'.

The interface units 72 and 74 are connected to the protection lines 6 and 6'.

The interface units 75 and 76 are connected to the lines 8 and 8' for a signal to be added/dropped within the optical terminal.

The respective interface units include receiving devices 10, 11, 12, 13, 14, and 15 for receiving a light signal from the terminal or system facing thereto respectively.

The light signals received at the interface units 10 and 12 are converted into electric signals, and are input to a line-switching device 51 within the work-line setting unit 30 and a line-switching device within the protection-line setting unit 30'.

The light signals received at the interface units 11 and 13 are converted into electric signals, and are input to a line-switching device 52 within the work-line setting unit 30 and a line-switching device within the protection-line setting unit 30'.

The interface units 14 and 15 may be configured so as to receive an electric signal or light signal.

The light signals or electric signals received at the interface units 14 and 15 are input to a line-switching device 53 within the work-line setting unit 30 and a line-switching device within the protection-line setting unit 30'.

The line-switching devices 51, 52, and 53 select any one of the line signals depending on the line status, and input the selected line signal to line-setting switches 60 and 60' (not shown).

The line-setting switch 60 sets a line to line-dividing devices 41, 42, and 43, and line-dividing devices within the expansion units 90 and 91 based on predetermined settings, and transmits the signal.

The line-dividing device 41 transfers the signal to a transmitting device 20 within the interface unit 71 on the work-line side and a transmitting device 22 within the interface unit 72 on the protection-line side respectively.

The line-dividing device 42 transfers the signal to a transmitting device 21 within the interface unit 73 on the work-line side and a transmitting device 23 within the interface unit 74 on the protection-line side respectively.

The line-dividing device 43 transfers the signal to a transmitting device 24 within the interface unit 75 on the work-line side and a transmitting device 25 within the interface unit 76 on the protection-line side respectively.

The transmitting device 20 converts the signal from the line-dividing device 41 into a light signal to transmit the signal to the optical terminal 3 via the work line.

The transmitting device 22 converts the signal from the line-dividing device 41 into a light signal to transmit the signal to the optical terminal 3 via the protection line.

The transmitting device 21 converts the signal from the line-dividing device 42 into a light signal to transmit the signal to the optical terminal 2 via the work line.

The transmitting device 23 converts the signal from the line-dividing device 42 into a light signal to transmit the signal to the optical terminal 2 via the protection line.

The transmitting device 24 transmits the signal from the line-dividing device 43 via the work line.

The transmitting device 25 transmits the signal from the line-dividing device 43 via the protection line.

Work and protection line switching can be performed using a various types of network application based on the above-described configurations.

In order to handle large-scale circuit capacity, the expansion units 90 and 91 which accommodate an additional line are provided to the above-described configuration of the main unit 100.

Bus-interface units 82 and 83 provided in the expansion units 90 and 91, and bus-interface units 80 and 81 provided in the work-line setting unit 30 transfer a light signal or electric signal each other.

The bus-interface units 80 and 81 are connected to the line-setting switch 60 respectively.

The line-setting switch 60 sets a line to the line-dividing devices 41', 42', and 43' of the work-line setting unit 31 of expansion units 90 and 91; or the bus-interface units 80 and 81 in accordance with predetermined settings.

The work-timing-clock generating unit 96 and the protection-timing-clock generating unit 96' are clock sources for supplying the system clock to the work-line setting unit 30, the protection-line setting unit 30', and the interface units 71, 72, 73, and 74.

A work clock unit 95 within the work-line setting unit 30 is a circuit for synchronizing the clock within the work-line setting unit 30 with the reference clock from the work-timing-clock generating unit 96.

According to the above-described configuration, the line-setting switch 60 can subject the signal from the work/protection line provided in the expansion units 90 and 91 to line setting to the optical terminals 2 and 3.

Similarly, the line-setting switch 60 can subject the signal from the optical terminal 2 or 3 to line setting to the work/protection line provided in the expansion units 90 and 91.

Further, the line-setting switch 60 can perform line setting of the expansion units 90 and 91.

The device within the optical terminal can operate the system in sync with the clock from the work-timing-clock generating unit 96 or the protection-timing-clock generating unit 96'.

Figure 3:
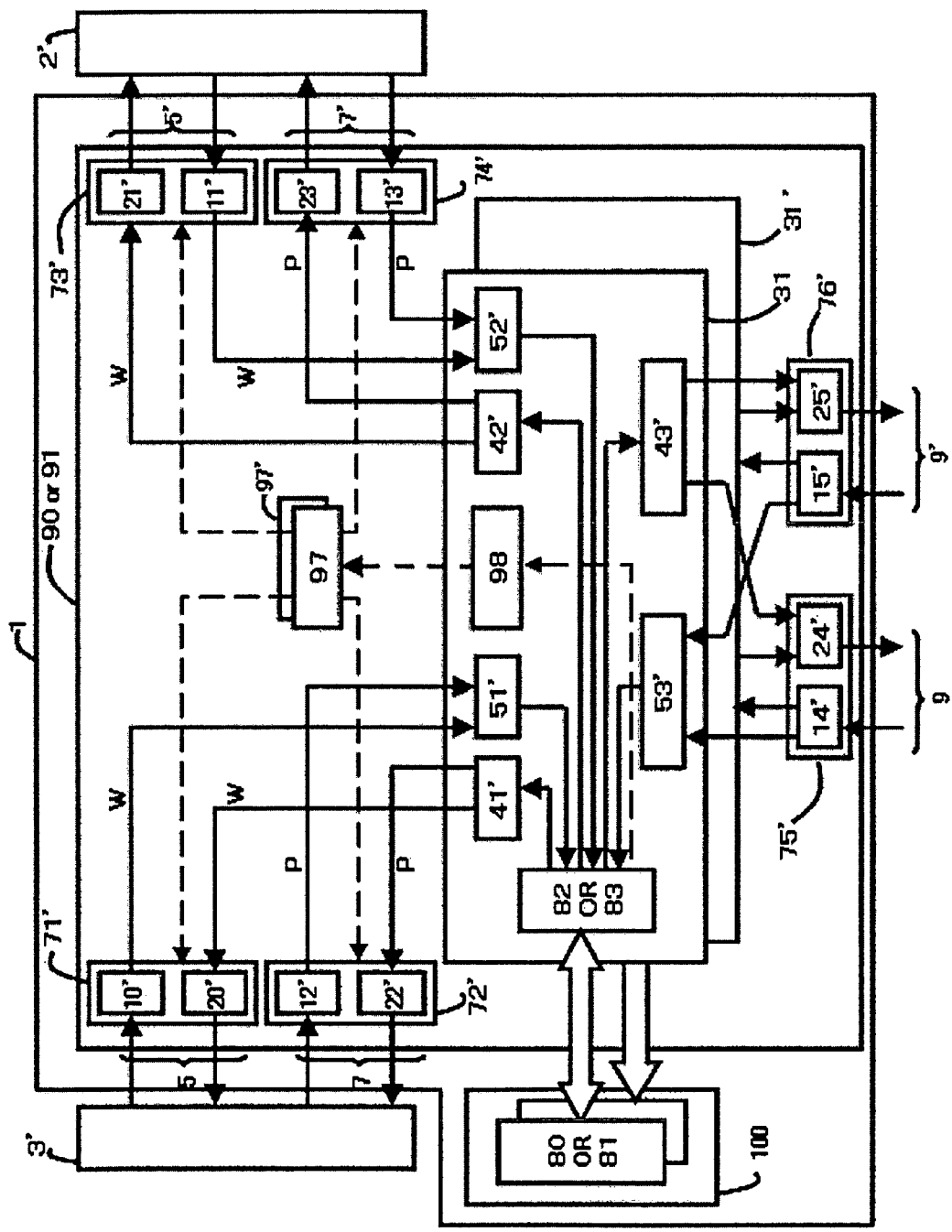
FIG. 3 is a diagram illustrating the configuration of expansion units 90 and 91.

FIG. 3 is a diagram illustrating the configurations of the expansion units 90 and 91.

The expansion units 90 and 91 are connected to optical terminals 2' and 3', work lines 5 and 5' made up of up and down link, protection lines 7 and 7' made up of up and down link, and lines 9 and 9' for adding/dropping a signal. With this embodiment of the present invention, the terminals 2' and 3' may be the terminals 2 and 3, or completely different terminals.

The expansion units 90 and 91 are configured in the shelf different from the main unit 100.

The expansion units 90 and 91 comprise intra-expansion-unit line setting units 31 and 31', interface units 71', 72', 73', 74', 75', and 76', an intra-expansion-unit work-timing-clock generating unit 97, and an intra-expansion-unit protection-timing-clock generating unit 97'.

The intra-expansion-unit line setting unit 31' has the same configuration as the intra-expansion-unit line setting unit 31, so the description of the intra-expansion-unit line setting unit 31' is omitted by describing the intra-expansion-unit line setting unit 31.

The intra-expansion-unit protection-timing-clock generating unit 97' has the same configuration as the intra-expansion-unit work-timing-clock generating unit 97, so the description of the intra-expansion-unit protection-timing-clock generating unit 97' is omitted by describing the intra-expansion-unit work-timing-clock generating unit 97.

The expansion units 90 and 91, and the optical terminal 2' or 3' perform communication via the interface units 71', 72', 73', and 74'.

The interface units 71' and 73' are connected to the work lines 5 and 5' respectively.

The interface units 72' and 74' are connected to the protection lines 7 and 7' respectively.

The interface units 75' and 76' are connected to the lines 9 and 9' for a signal to be added/dropped within the optical terminal respectively.

The respective interface units include receiving devices 10', 11', 12', 13', 14', and 15' for receiving a light signal from the terminal or system facing thereto respectively.

The light signals received at the interface units 10' and 12' are converted into electric signals, and are input to a line-switching device 51' within the intra-expansion-unit line setting unit 31 and a line-switching device within the intra-expansion-unit line setting unit 31'.

The light signals received at the receiving devices 11' and 13' are converted into electric signals, and are input to a line-switching device 52' within the intra-expansion-unit line setting unit 31 and a line-switching device within the intra-expansion-unit line setting unit 31'.

The light signals or electric signals received at the receiving devices 14' and 15' are converted into electric signals, and are input to a line-switching device 53' within the intra-expansion-unit line setting unit 31 and a line-switching device within the intra-expansion-unit line setting unit 31'.

The receiving devices 14' and 15' may be configured so as to receive an electric signal.

The line-switching devices 51', 52', and 53' select any one of the line signals depending on the line status, and outputs the selected line signal to the bus-interface unit 82 or 83.

The bus-interface unit 82 or 83 transmits or receives a signal as to the bus-interface unit 80 or 81.

At this time, not only transmission or reception of a signal but also distribution of the reference clock to be set within the main unit 100 are performed simultaneously. The bus-interface unit 82 or 83 receives the reference clock from the bus-interface unit 80 or 81.

Synchronization control of the clock to be generated at the intra-line-setting-unit work clock unit 98 of the intra-expansion-unit line setting unit 31 is performed based on the reference clock from the bus-interface unit 82 or 83.

Communication performed between the bus-interface units is preferably performed using a light signal, but can be realized using an electric signal.

The bus-interface unit 80 or 81 transmits a signal to the line-setting switch 60 in FIG. 2.

The line-setting switch 60 sets a line to the line-dividing devices 41, 42, and 43, and the line-dividing devices 41', 42', and 43' within the expansion units 90 and 91 in accordance with predetermined settings, and transmits the signal.

The line-dividing device 41' transfers the signal to a transmitting device 20' within the interface unit 71' on the work-line side and a transmitting device 22' within the interface unit 72' on the protection-line side respectively.

The line-dividing device 42' transfers the signal to a transmitting device 21' within the interface unit 73' on the work-line side and a transmitting device 23' within the interface unit 74' on the protection-line side respectively.

The line-dividing device 43' transfers the signal to a transmitting device 24' within the interface unit 75' on the work-line side and a transmitting device 25' within the interface unit 76' on the protection-line side respectively.

The transmitting device 20' converts the signal from the line-dividing device 41' into a light signal to transmit the signal to the optical terminal 3' via the work line 5.

The transmitting device 22' converts the signal from the line-dividing device 41' into a light signal to transmit the signal to the optical terminal 3' via the protection line 7.

The transmitting device 21' converts the signal from the line-dividing device 42' into a light signal to transmit the signal to the optical terminal 2' via the work line 5'.

The transmitting device 23' converts the signal from the line-dividing device 42' into a light signal to transmit the signal to the optical terminal 2' via the protection line 7'.

The transmitting device 24' transmits the signal from the line-dividing device 43' via the work line 9.

The transmitting device 25' transmits the signal from the line-dividing device 43' via the protection line 9'.

Work and protection line switching can be performed in the expansion units 90 and 91 using a various types of network application based on the above-described configurations.

The interface units 71 through 76 of the main unit 100, the work and protection line setting units 30 and 30', and the work and protection timing-clock generating units 96 and 96' are configured of a different circuit board respectively, and are connected using backboard wiring within the shelf.

The interface units 71' through 76' of the expansion units 90 and 91, the intra-expansion-unit line setting units 31 and 31', and the intra-expansion-unit work and protection timing-clock generating units 97 and 97' are configured of a different circuit board respectively, and are connected using backboard wiring within the shelf.

The configurations of the following first through third embodiments can be applied to the above-described configurations in FIG. 2 and FIG. 3.

Figure 4:
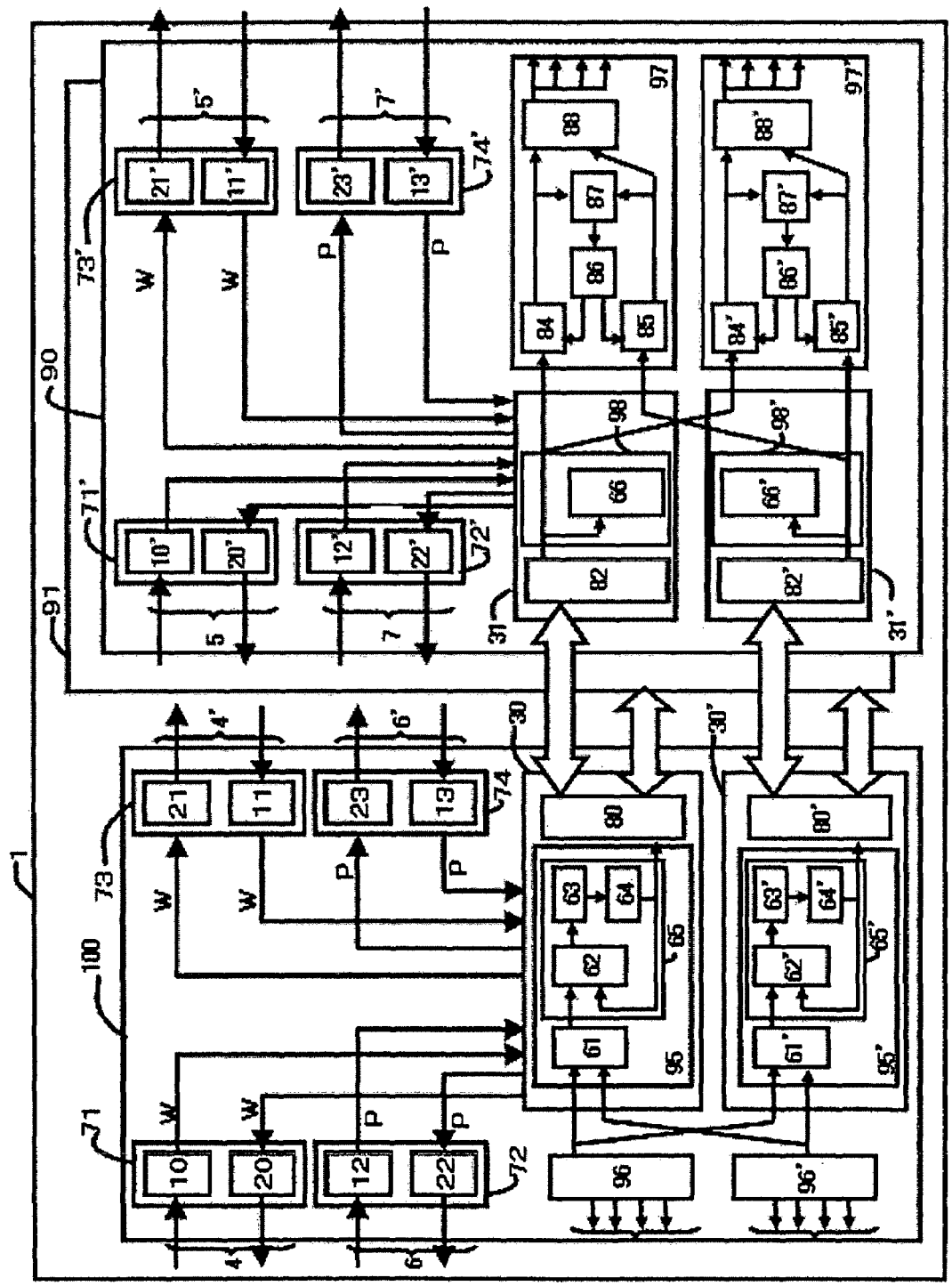
FIG. 4 is a diagram illustrating the specific configuration of a first embodiment.

FIG. 4 is a diagram illustrating the specific configuration of the first embodiment.

FIG. 4 illustrates the relationship between the work-line setting unit 30 and protection-line setting unit 30', and the intra-expansion-unit line setting units 31 and 31'.

The same members as in FIG. 2 and FIG. 3 are appended with the same numbers, and the descriptions thereof are omitted.

Further, the intra-expansion-unit line setting unit 31' and the intra-expansion-unit protection-timing-clock generating unit 97' are the same configurations as the intra-expansion-unit line setting unit 31 and the intra-expansion-unit work-timing-clock generating unit 97, so the same function units are appended with a dash on the same numbers, and the descriptions thereof are omitted.

Further, the expansion unit 91 has the same configuration as the expansion unit 90, the description of the expansion unit 90 is omitted by describing the expansion unit 91.

The clock from the work-timing-clock generating unit 96 or the protection-timing-clock generating unit 96' is input to a circuit-changing switch 61 of the work-line setting unit 30.

The circuit-changing switch 61 selects the reference clock from the work-timing-clock generating unit 96 or the reference clock from the protection-timing-clock generating unit 96' depending on the line status, and outputs the selected clock.

The reference clock from the circuit-changing switch 61 is input to a phase comparator 62 within a phase locked loop (PLL) circuit 65.

The phase comparator 62 outputs the comparison result between the clock from a voltage-controlled oscillator 64 and the reference clock to a loop filter 63.

The loop filter 63 converts phase difference pulses into a voltage value to output this to the voltage-controlled oscillator 64.

The voltage-controlled oscillator 64 outputs the clock to the phase comparator 62 and the bus-interface unit 80. The bus-interface unit 80 outputs/inputs a signal to be transmitted to the line-setting switch in FIG. 2, and also outputs the reference clock from the voltage-controlled oscillator 64 to the bus-interface unit 82.

The bus-interface unit 82 of the intra-expansion-unit line setting unit 31 provided within the expansion unit 90 transmits the received reference clock to the intra-line-setting-unit work clock unit 98.

The intra-line-setting-unit work clock unit 98 synchronizes the phase with the reference clock using a PLL circuit 66, and also outputs the reference clock to the intra-expansion-unit work-timing-clock generating unit 97.

The intra-expansion-unit work-timing-clock generating unit 97 comprises variable delay elements 84 and 85, a phase control circuit 86, a phase comparator 87, and a clock selection circuit 88.

The variable delay element 84 is made up of step-delay or the like, receives the reference clock from the intra-line-setting-unit work clock unit 98, and controls the phase of the reference clock by the amount of delaying being controlled by the phase control circuit 86.

The variable delay element 85 is made up of step-delay or the like, receives the reference clock from the intra-line-setting-unit protection clock unit 98', and controls the phase of the reference clock by the amount of delaying being controlled by the phase control circuit 86.

The variable delay elements 84 and 85 are clock pull-in means for controlling the phase of the work or protection reference clock.

The phase comparator 87 inputs the clocks from the variable delay element 84 and 85, and informs the phase control circuit 86 of the result of detecting the phase difference between the clocks.

The phase control circuit 86 controls the variable delay element 84 and the variable delay element 85 respectively based on the phase comparison result from the phase comparator 87.

The clock selection circuit 88 switches the clocks from the variable delay element 84 and the variable delay element 85, and outputs the clock switched to the respective devices within the expansion unit 90 (interface units 71' through 74' etc.) respectively.

Figure 5:
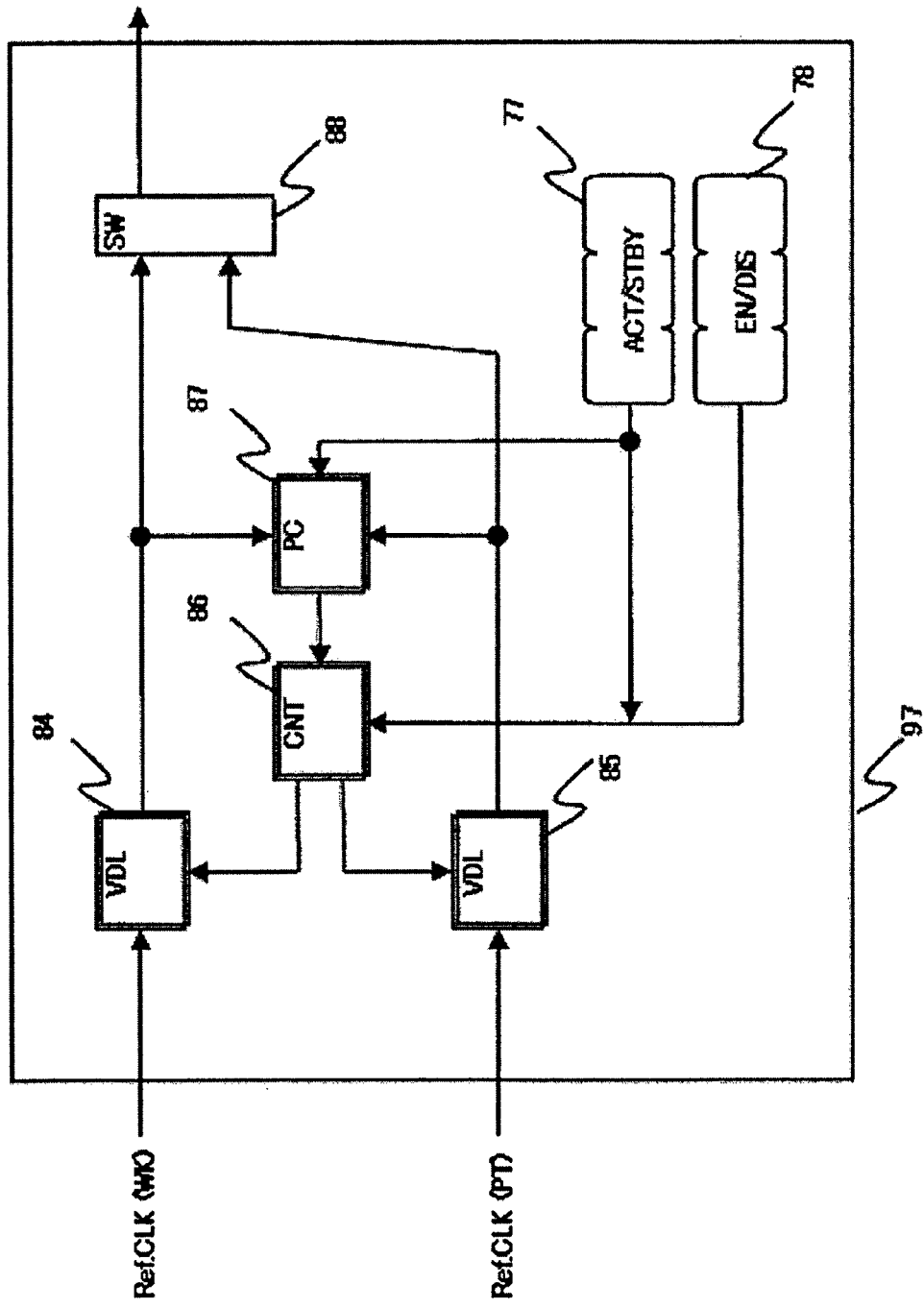
FIG. 5 is a diagram describing control operation of an intra-expansion-unit work-timing-clock generating unit.

FIG. 5 is a diagram describing specific control operation of the intra-expansion-unit work-timing-clock generating unit 97. The same configurations as in FIG. 4 are appended with the same numbers.

A work/protection setting circuit 77 is a circuit for informing the phase detection circuit and the phase control circuit of the status information of the reference clock which is currently used.

The status information of the reference clock is information for variably controlling the variable delay element of the reference clock on the not-running-state side (waiting side or standby side) based on the system operation information within the optical terminal.

An operation/non-operation setting circuit 78 is a circuit for setting operation and non-operation of the phase detection circuit and the phase control circuit.

Normally, the phase detection circuit and the phase control circuit are set in an operating state, but in the event of operation wherein the respective circuits within the device need no phase adjustment control, the phase detection circuit and the phase control circuit are set in an inoperative state.

Figure 6:
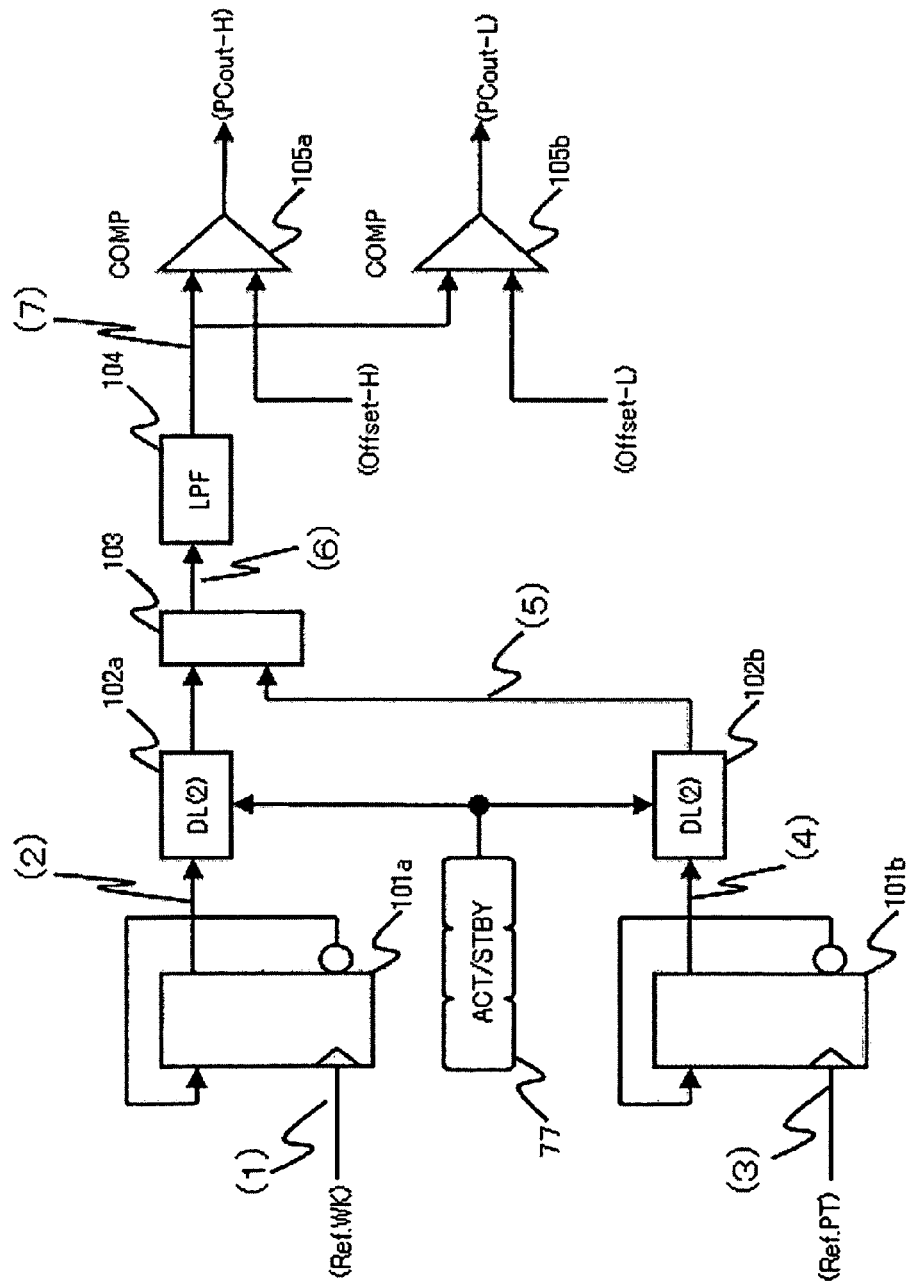
FIG. 6 is a diagram illustrating the configuration of a phase detection circuit.

FIG. 6 is a diagram illustrating the specific configuration of the phase detection circuit.

Figure 7:
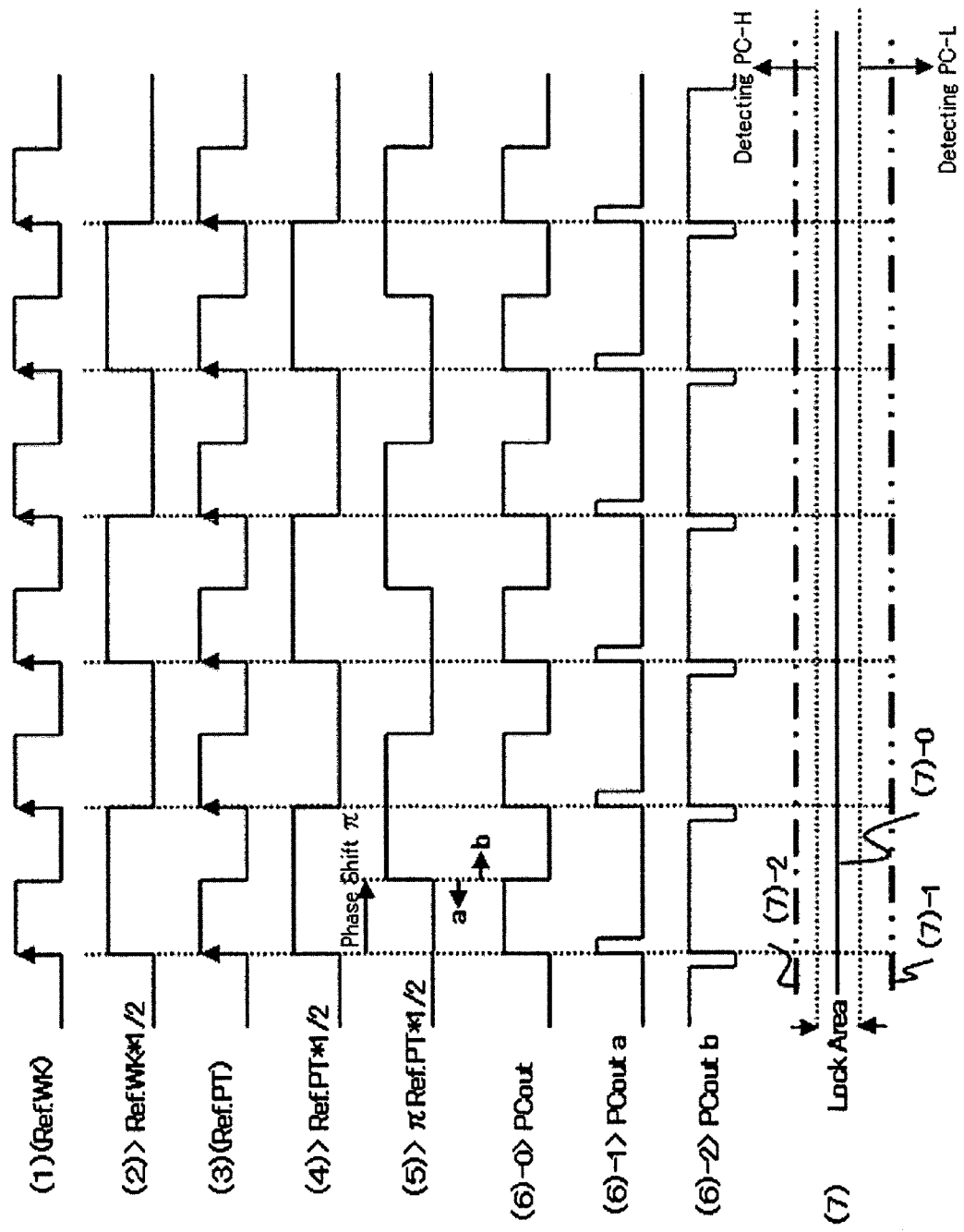
FIG. 7 is a diagram illustrating the signal status of each unit of the phase detection circuit.

Also, FIG. 7 is a diagram illustrating the signal status of the respective units of the phase detection circuit.

A phase detection circuit 87 comprises ½ frequency dividers 101a and 101b, fixed delay circuits 102a and 102b, an exclusive-OR circuit 103, an integration circuit 104, and bias-voltage comparators 105a and 105b.

The ½ frequency divider 101a receives the reference clock from the bus-interface unit 82 via the intra-line-setting-unit work clock unit 98.

The signal in FIG. 7 (1) is input to the position in FIG. 6 (1).

Further, the ½ frequency divider 101a divides the received reference clock (FIG. 7 (1)) into ½ frequency. The clock in FIG. 7 (2) is output at the position in FIG. 6 (2).

The ½ frequency divider 101b receives the reference clock from the bus-interface unit 82' via the intra-line-setting-unit work clock unit 98'. The clock shown in FIG. 7 (3) is received at the position in FIG. 6 (3).

Further, the ½ frequency divider 101b divides the received reference clock (FIG. 7 (3)) into ½ frequency.

The clock in FIG. 7 (4) is output at the position in FIG. 6 (4).

The clock signal in FIG. 7 (2) is input to the fixed delay circuit 102a.

In the event that the work/protection setting circuit 77 inputting the information indicating that the clock on the work side is in use, the fixed delay circuit 102a outputs the clock signal to the exclusive-OR circuit 103 without applying fixed delaying.

On the other hand, the clock signal shown in FIG. 7 (4) is input to the fixed delay circuit 102b.

In the event that the work/protection setting circuit 77 inputting the information indicating that the clock on the work side is in use, the fixed delay circuit 102b applies the phase for pi to the clock signal shown in FIG. 7 (4), and then outputs the clock signal to the exclusive-OR circuit 103.

Accordingly, the output position (FIG. 6 (5)) of the fixed delay circuit 102b becomes the clock status in FIG. 7 (5).

The exclusive-OR circuit 103 input the output from the fixed delay circuits 102a and 102b (FIGS. 7 (2) and (5)).

The exclusive-OR circuit 103 takes the exclusive-OR of the clock signals in FIGS. 7 (2) and (5).

The output position of the exclusive-OR circuit 103 (FIG. 6 (6)) is shown in FIGS. 7 (6)-0 through (6)-2.

FIG. 7 (6)-0 illustrates a phase status when both clocks are synchronized.

FIG. 7 (6)-1 illustrates a phase status wherein the clock on the protection side is delayed.

FIG. 7 (6)-2 illustrates a phase status wherein the clock on the protection side is advanced.

FIGS. 7 (6)-0 through (6)-2, which are the output of the exclusive-OR circuit 103, are input to the integration circuit (loop filter) 104.

The integration circuit 104 converts the signals in FIGS. 7 (6)-0 through (6)-2 into voltage values respectively.

The voltage values of the output position (7) of the integration circuit 104 are shown in FIGS. 7 (7)-0 through (7)-2.

FIG. 7 (7)-0 is the voltage output in the case that the signal in FIG. 7 (6)-0 is input to the integration circuit 104 in a synchronous status.

FIG. 7 (7)-1 is the voltage output in the case that the signal in FIG. 7 (6)-1 is input to the integration circuit 104 in a phase-shift status.

FIG. 7 (7)-2 is the voltage output in the case that the signal in FIG. 7 (6)-2 is input to the integration circuit 104 in a phase-shift status.

The output of the integration circuit 104 (FIGS. 7 (7)-0 through (7)-2) is input to the bias-voltage comparators 105a and 105b.

With the bias-voltage comparator 105a, the PC-H detection voltage shown in FIG. 7 (7) is set as an offset voltage.

With the bias-voltage comparator 105b, the PC-L detection voltage shown in FIG. 7 (7) is set as an offset voltage.

The bias-voltage comparators 105a and 105b compare an input voltage with the offset voltage, and outputs the size relation thereof With the present embodiment, the bias-voltage comparator 105a outputs a high signal in the case that the input voltage is greater than the offset voltage.

The bias-voltage comparator 105b outputs a high signal in the case that the input voltage is smaller than the offset voltage.

Figure 8:
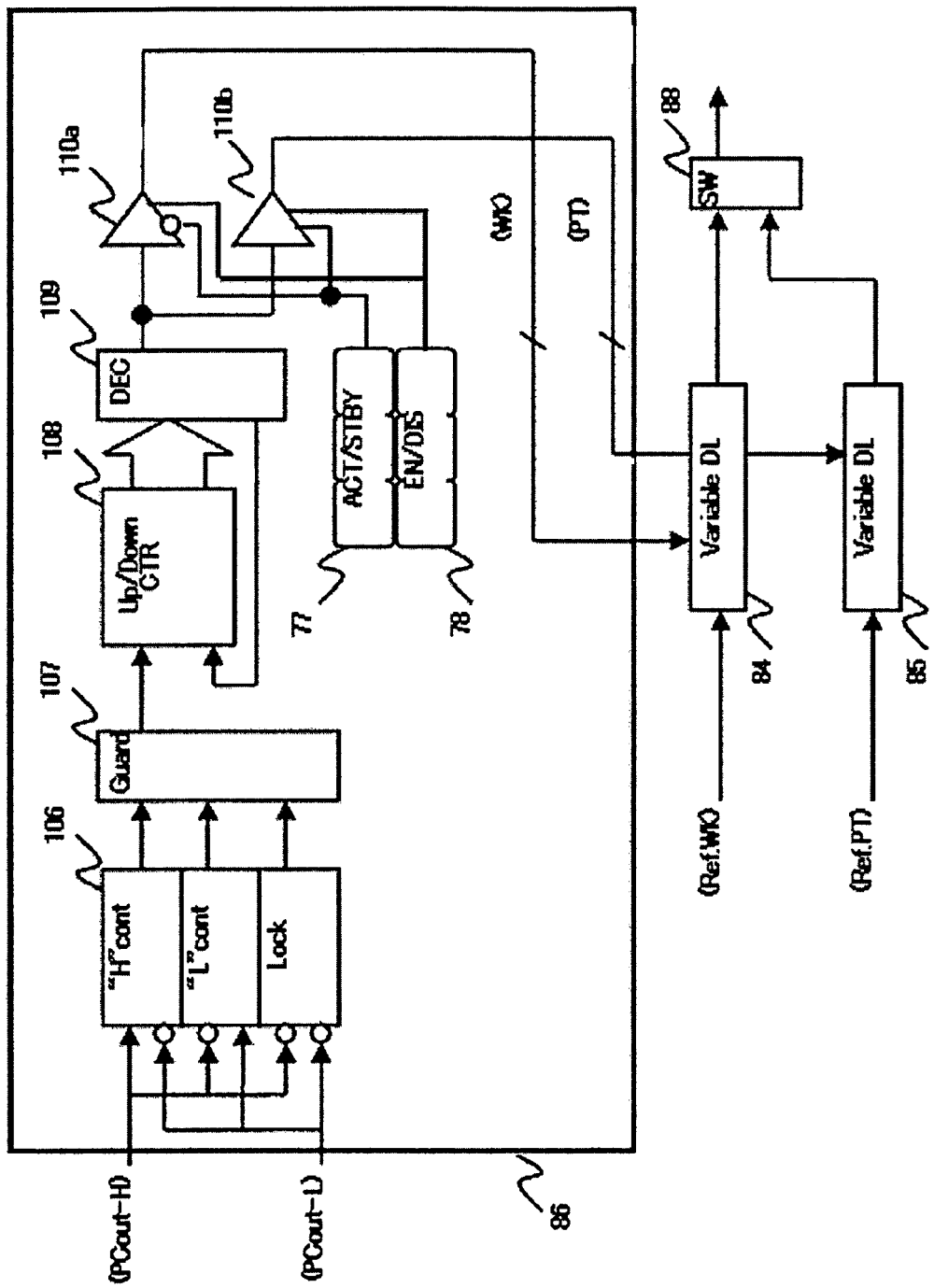
FIG. 8 is a diagram illustrating the specific configuration of a phase control circuit.

FIG. 8 is a diagram illustrating the specific configuration of the phase control circuit.

The phase control circuit 86 comprises a phase difference correction determination circuit 106, a protection circuit 107, an up-and-down counter 108, a decoding circuit 109, and output buffer circuits 110a and 110b.

The phase difference correction determination circuit 106 takes the clock on the work side (clock in FIG. 7 (1)) as the reference, and in the even that the clock on the protection side (clock in FIG. 7 (3)) is delayed, obtains high output from the bias-voltage comparator 105a in FIG. 6, and also obtains low output from the bias-voltage comparator 105b.

Accordingly, a control flag ("H" cont) for advancing the phase of the clock in FIG. 7 (3) is set to on.

The phase difference correction determination circuit 106 takes the clock on the work side (clock in FIG. 7 (1)) as the reference, and in the even that the clock on the protection side (clock in FIG. 7 (3)) is advanced, obtains high output from the bias-voltage comparator 105b in FIG. 6, and also obtains low output from the bias-voltage comparator 105a.

Accordingly, a control flag ("L" cont) for delaying the phase of the clock in FIG. 7 (3) is set to on.

The phase difference correction determination circuit 106 takes the clock on the work side (clock in FIG. 7 (1)) as the reference, and in the even that the phase of the clock on the protection side (clock in FIG. 7 (3)) is matched therewith, obtains low output from the bias-voltage comparator 105a in FIG. 6, and also obtains low output from the bias-voltage comparator 105b. Accordingly, a control flag ("LOCK" cont) for unchanging the phase of the clock in FIG. 7 (3) is set to on.

The protection circuit 107 monitors the state wherein there is no fluctuation in the determined results during a steady period based on the flag from the phase difference correction determination circuit 106 such that control of the variable delay circuits 84 and 85 is not flustered, and outputs the control flag to the up-and-down counter 108 when satisfying the condition.

The up-and-down counter 108 outputs increase, attenuation, and suspension of control as to the previous control direction to the decoding circuit 109 based on the control flag from the protection circuit 107.

The decoding circuit 109 decodes the output value of the up-and-down counter 108 so as to be converted into the addresses of the variable delay elements 84 and 85.

The output buffer circuits 110a and 110b control the output of the decoding circuit 109 based on the flag of the work/protection setting circuit 77.

The configurations in FIG. 6 and FIG. 7 employ the work clock, so the output buffer circuit 110a performs locking so as not to control the variable delay element 84, and the output buffer circuit 110b performs unlocking so as to control the variable delay element 84.

In the event that the protection clock is taken as the reference for operation, on the contrary, the output buffer circuit 110a performs unlocking, and the output buffer circuit 110b performs locking, based on the flag of the work/protection setting circuit 77.

Figure 9:
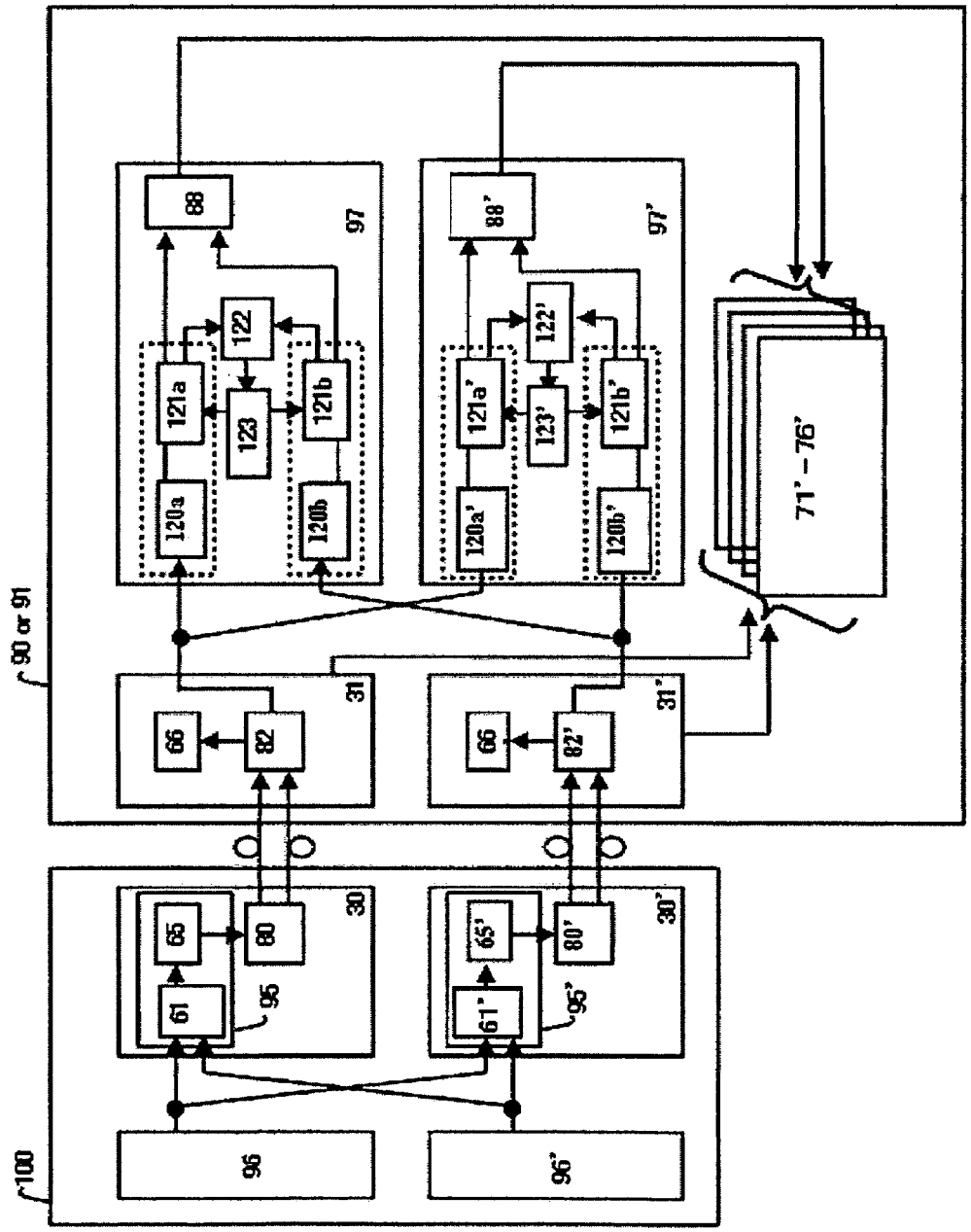
FIG. 9 is a diagram illustrating a second embodiment.

FIG. 9 is a diagram illustrating the second embodiment.

FIG. 9 illustrates an arrangement wherein the clock signals on both work and protection sides serving as a phase monitoring target are converted into multiplied clock signals, the multiplied clock signals are counted, and the timing for dividing operation of the multiplied clock signals is feedback controlled based on the phase comparison results.

According to this loop control, performing locking in the event that the desired positional relation is satisfied enables phase correction processing to be automatically performed.

In FIG. 9, the same configurations as FIG. 4 are appended with the same numbers, and the descriptions thereof are omitted. Specifically, the configurations of the intra-expansion-unit work-timing-clock generating unit 97 and the intra-expansion-unit protection-timing-clock generating unit 97' are different from those in FIG. 4.

The intra-expansion-unit work-timing-clock generating unit 97 comprises PLL circuits 120a and 120b, phase adjustment units 121a and 121b, a phase detection circuit 122, and a phase control circuit 123.

The intra-expansion-unit protection-timing-clock generating unit 97' has the same configuration as the intra-expansion-unit work-timing-clock generating unit 97, so the same members are appended with a dash on the same number, and the descriptions thereof are omitted.

The combination between the PLL circuit 120a and the phase adjustment unit 121a, and the combination between the PLL circuit 120b and the phase adjustment unit 121b make up clock pull-in means respectively.

The PLL circuits 120a and 120b of the intra-expansion-unit work-timing-clock generating unit 97 multiply the reference clock on the work side and the reference clock on the protection side which are transmitted from the intra-expansion-unit line setting units 31 and 31' by the main unit 100 respectively.

The phase adjustment units 121a and 121b count the clock signal multiplied by the PLL circuits 120a and 120b, and output the counted result to the phase detection circuit 122.

The phase detection circuit 122 performs phase comparison based on the counter value output from the phase adjustment units 121a and 121b, and outputs the phase comparison result to the phase control circuit 123.

The phase control circuit 123 carries out dividing of the clock signal multiplied by the phase adjustment units 121a and 121b, and adjusts the timing at the time of returning to the original clock, based on the phase comparison results of the phase detection circuit 122.

The phase adjustment units 121 a and 121 b outputs the clock signal of which timing was adjusted by the phase control circuit 123 to a clock selection circuit 88.

The clock selection circuit 88 supplies the selected clock to the interface units 71' through 76' within the expansion unit 90 or 91 respectively.

Figure 10:
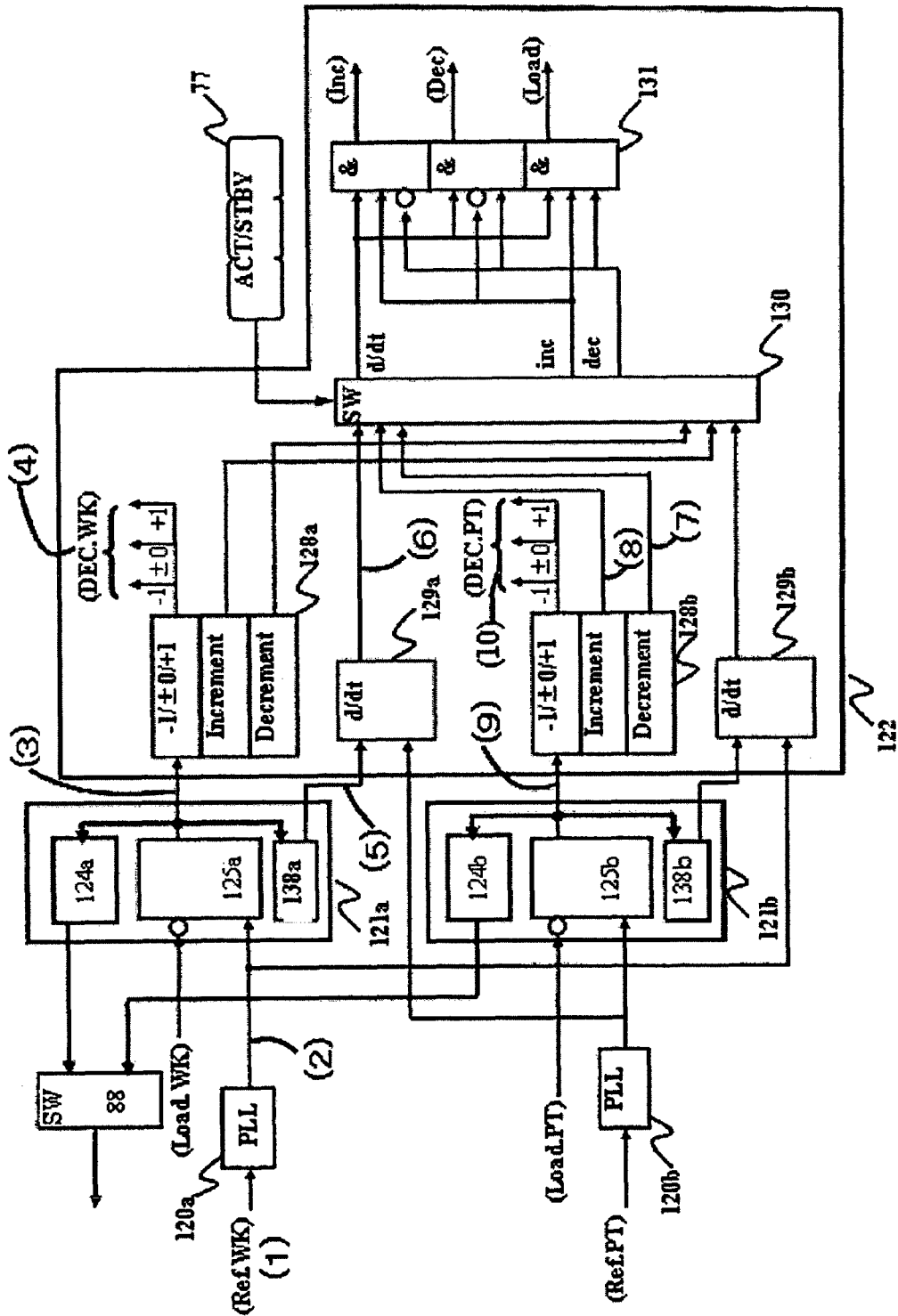
FIG. 10 is a diagram illustrating the configuration of phase adjustment units and a phase detection circuit.

FIG. 10 is a diagram illustrating the configurations of the phase adjustment unit and the phase detection circuit.

The phase adjustment units 121a and 121b comprise counter circuits 125a and 125b, and decoding circuits 124a and 124b.

The phase detection circuit 122 comprises timing control pulse generating circuits 128a and 128b, differential circuits 129a and 129b, a control-direction switching circuit 130, and a phase correction determination circuit 131.

The counter circuits 125a and 125b count the clock signal multiplied by 16 at the PLL circuits 120a and 120b, and output a hexadecimal value 0 through f to the timing control pulse generating circuits 128a and 128b within the phase detection circuit 122, and the decoding circuits 138a and 138b respectively.

The decoding circuits 138a and 138b create a signal to be pierced at the facing PLL circuits 120a and 120b from the values of the counter circuits 125a and 125b, and output the differential circuits 129a and 129b within the phase detection circuit 122.

The signal to be pierced at the PLL circuits 120a and 120b comprises two bits of a load timing bit of the counter value, and the preceding bit thereof The timing control pulse generating circuits 128a and 128b within the phase detection circuit 122 generate a window signal for determining increment/decrement from the counter value, and a timing control load pulse made up of −1, ±0, and +1 for timing control respectively.

Each window signal has a 4-bit margin area, and between an increment window and a decrement window has a 3-bit margin area.

An increment detection area sets an edge at the position between counter values 1 and 0.

A decrement detection area sets an edge at the position between counter values d and e.

These window signals are input to the control-direction switching circuit 130, and the timing control load pulse is input to the control signal switching circuit 126 of the phase control circuit 123.

The differential circuit 129a within the phase detection circuit 122 pierces the signal from the decoding circuit 138a with the signal multiplied at the PLL circuit 120b, and the differential circuit 129b pierces the signal from the decoding circuit 138b with the signal multiplied at the PLL circuit 120a.

The output signals of the differential circuits 129a and 129b are input to the control-direction switching circuit 130 respectively.

The control-direction switching circuit 130 outputs the output combination between the differential circuit 129a and the timing control pulse generating circuit 128b, or the output combination between the differential circuit 129b and the timing control pulse generating circuit 128a to the phase correction determination circuit 131 in accordance with the work/protection setting of the work/protection setting circuit 77.

The phase correction determination circuit 131 comprises three 3-input AND circuits.

The AND circuit for outputting an increment control status includes an inverter at the input terminal of the decrement window, and sets the output thereof to 1 when the output of the differential circuit is "1", the increment window is "1", and the decrement window is "0".

The AND circuit for outputting an decrement control status includes an inverter at the input terminal of the increment window, and sets the output thereof to 1 when the output of the differential circuit is "1", the increment window is "0", and the decrement window is "1".

The AND circuit for loading is a normal AND circuit, and sets the output thereof to 1 when all of the outputs are "1".

Figure 11:
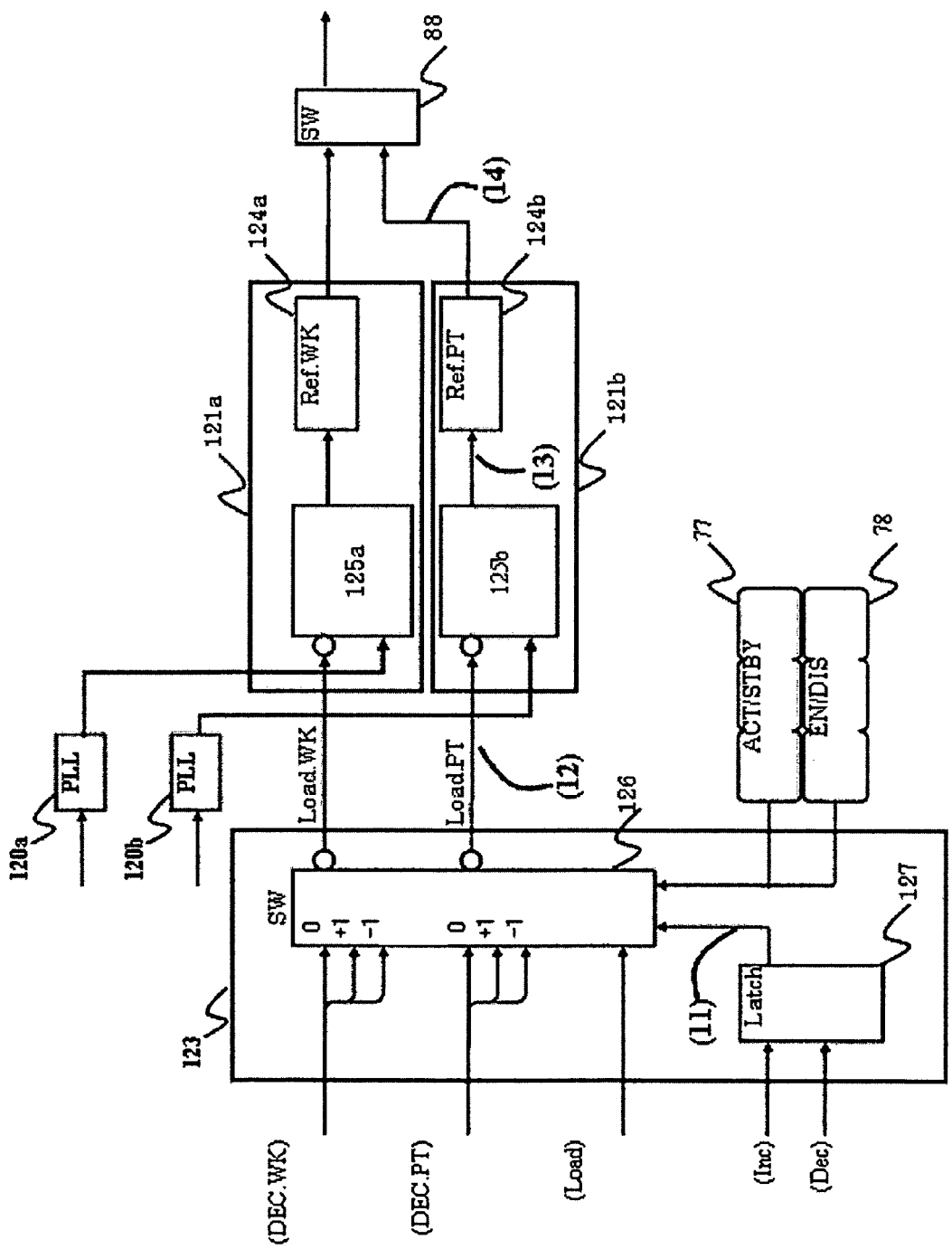
FIG. 11 is a diagram illustrating the configuration of phase adjustment units and a phase control circuit.

FIG. 11 is a diagram illustrating the configurations of the phase adjustment unit and the phase control circuit.

The phase control circuit 123 comprises a control-signal switching circuit 126, and a holding circuit 127.

The holding circuit 127 inputs the signals from the AND circuit for outputting an increment control status and the AND circuit for outputting a decrement control status of the phase correction determination circuit 131, performs latch processing for one cycle of the reference clock to be input to the PLL circuits 120a and 120b, and input the output thereof to the control-signal switching circuit 126.

The control-signal switching circuit 126 selects the timing control load pulse from the timing control pulse generating circuit 128a on the work side or the timing control load pulse from the timing control pulse generating circuit 128b on the protection side in accordance with the set value of the work/protection setting circuit 77.

Further, the control-signal switching circuit 126 selects any one of "−1", "±0", and "+1" of the timing control pulse generating circuits 128a and 128b based on the increment or decrement information held at the holding circuit 127.

The control-signal switching circuit 126 selects "+1" as the timing control load pulse in the event that the increment output is "1", and the decrement output is "0".

The control-signal switching circuit 126 selects "−1" as the timing control load pulse in the event that the increment output is "0", and the decrement output is "1".

The control-signal switching circuit 126 selects "+0" as the timing control load pulse in the event that the increment output is "0", and the decrement output is "0".

Further, the control-signal switching circuit 126 forcibly outputs a signal to be loaded to the counter circuits 125a and 125b in the event that the status from the AND circuit for loading of the phase correction determination circuit 131 is "1".

Thus, in the event that the phase detection result exceeds the window width, correction processing which instantly makes into same phase.

The timing control load pulse set by the control-signal switching circuit 126 resets the counter values of the counter circuits 125a and 125b to an initial value "0".

The decoding circuits 124a and 124b perform dividing by decoding the clock signal obtained by decoding the count values of the counter circuits 125a and 125b, and multiplying by 16 so as to become the original clock cycle.

Figure 12:
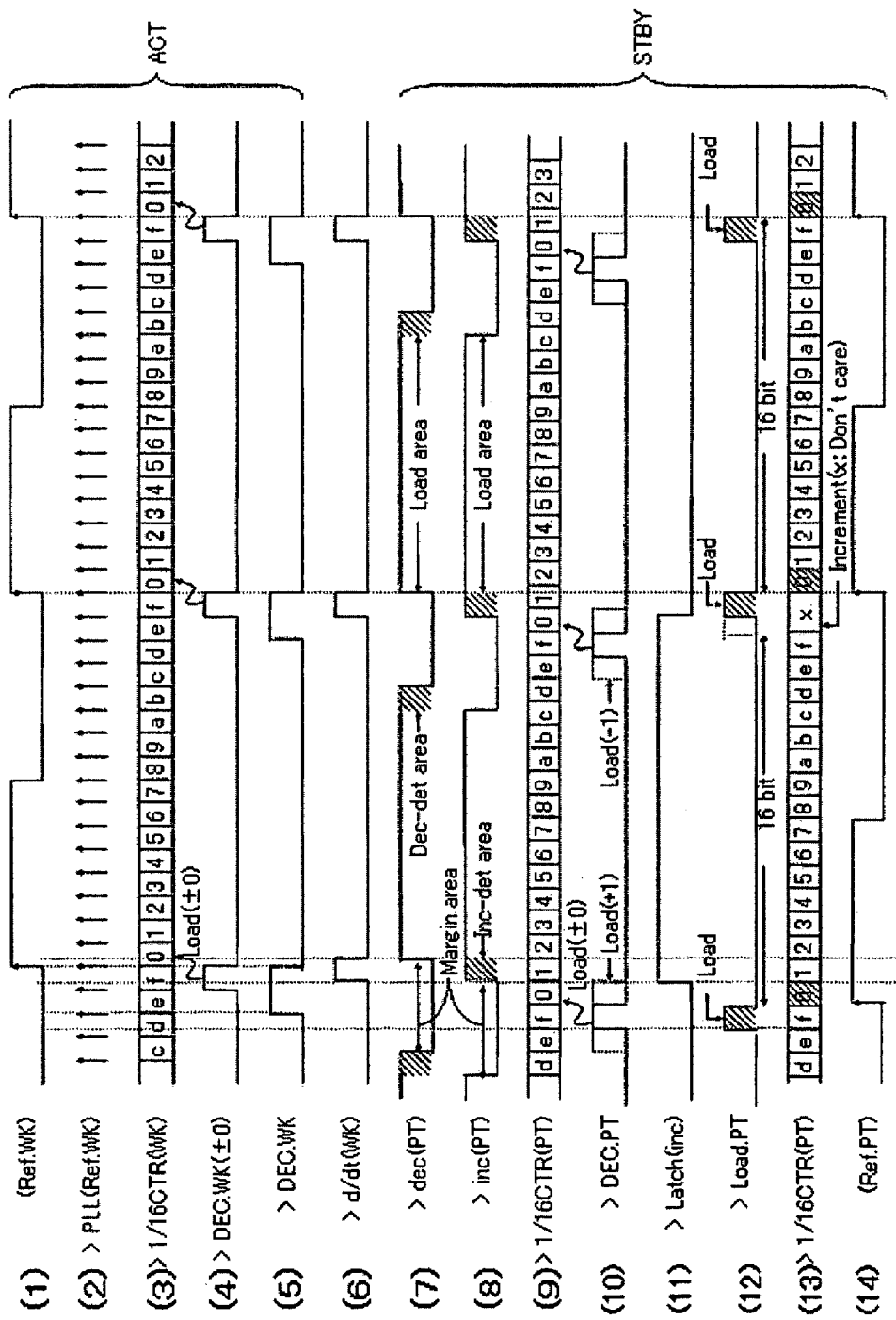
FIG. 12 is a diagram illustrating the signal of each unit of the phase adjustment units, phase detection circuit, and the phase control circuit.

FIG. 12 is a diagram illustrating the signal of each unit of the phase adjustment unit, phase detection circuit, and phase control circuit.

FIG. 12 illustrates the signal status of each unit in the case of enabling the reference clock on the work side to be work with the configurations in FIG. 10 and FIG. 11.

FIG. 12 (1) illustrates the reference clock to be input to the PLL circuit 120a in FIG. 10 and FIG. 11.

FIG. 12 (2) illustrates the clock signal multiplied by 16 at the PLL circuit 120a in FIG. 10 and FIG. 11.

FIG. 12 (3) illustrates the count result of the clock signal from the PLL circuit 120a counted by the counter circuit 125a in FIG. 10.

FIG. 12 (4) illustrates the timing control pulse generated by the timing control pulse generating circuit 128a in FIG. 10 based on the count result of the counter circuit 125a.

FIG. 12 (5) illustrates the output of the decoding circuit 138a in FIG. 10.

FIG. 12 (6) illustrates the output of the differential circuit 129a in FIG. 10.

FIG. 12 (7) illustrates the decrement detection window signal of the timing control pulse generating circuit 128b in FIG. 10.

FIG. 12 (8) illustrates the increment detection window signal of the timing control pulse generating circuit 128b in FIG. 10.

FIG. 12 (9) illustrates the result of the counter circuit 125b in FIG. 10 counting the clock signal from the PLL circuit 120b.

FIG. 12 (10) illustrates the timing control pulse generated by the timing control pulse generating circuit 128b in FIG. 10 based on the count result of the counter circuit 125b.

FIG. 12 (11) illustrates the holding timing within the holding circuit in FIG. 11.

FIG. 12 (12) illustrates the output of the control-signal switching circuit 126 in FIG. 11.

FIG. 12 (13) illustrates a state wherein the reference clock on the protection side is led in the reference clock on the work side.

FIG. 12 (14) illustrates the output of the decoding circuit 124b.

If FIG. 12 (1) is compared with FIG. 12 (9), the clock signal obtained by multiplying the reference clock by 16 is shifted in a range of one bit.

Accordingly, the signal in FIG. 12 (6) straddles the increment detection area (Inc-det area) in FIG. 12 (8).

On the other hand, the signal in FIG. 12 (6) does not straddle the decrement detection area (Dec-det area) in FIG. 12 (7).

The control-direction switching circuit 130 in FIG. 10 obtained the flag indicating operation under the reference clock on the work side from the work/protection setting circuit 77, so selects the output of the timing control pulse generating circuit 128b and the output of the differential circuit 129a, and outputs these to the phase correction determination circuit 131.

Upon the control-signal switching circuit 126 inputting the increment control signal which was delayed for one cycle of the reference clock by the holding circuit 127 and the decrement control flag of the phase correction determination circuit 131, the control-signal switching circuit 126 selects the timing control load pulse "+1" of the timing control pulse generating circuit 128b at the position delayed for one cycle of the reference clock, and outputs this to the counter circuit 125b.

This state can be understood from FIG. 12 (11) and FIG. 12 (12).

The counter circuit 125b in FIG. 10 and FIG. 11 can change the counter value to FIG. 12 (13) by the load pulse in FIG. 12 (12) resetting and updating the counter value.

The decoding circuit 124b can generate the protection reference clock in sync with the work reference clock using the same cycle as the reference clock such as shown in FIG. 12 (14) by decoding the pulse based on the counter value of FIG. 12 (13).

With the present configuration of the second embodiment, multiplying and dividing are performed, but multiplying and dividing values are examples, and the values thereof can take arbitrary values.

Figure 13:
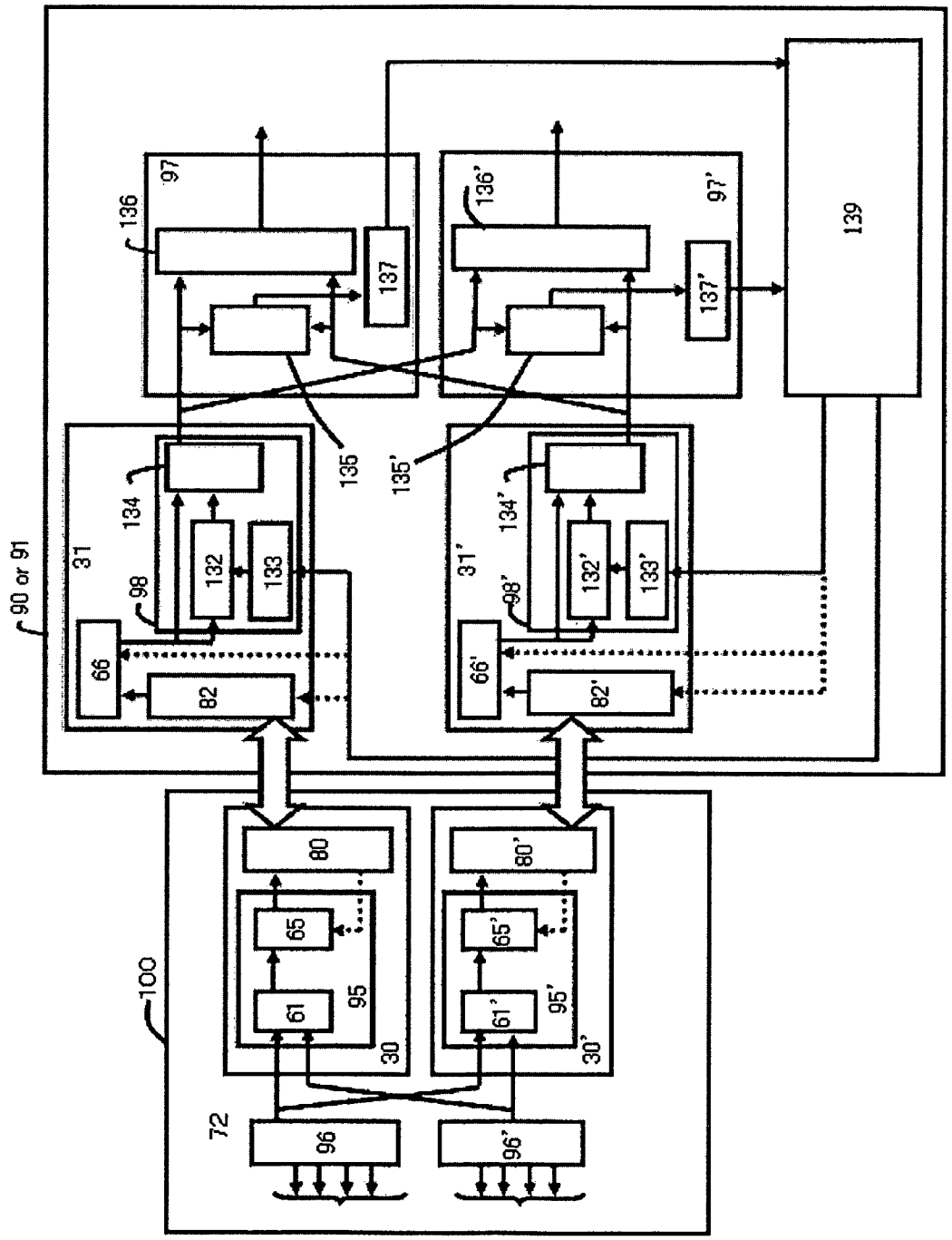
FIG. 13 is a diagram illustrating a third embodiment.

FIG. 13 is a diagram illustrating the third embodiment.

FIG. 13 is principally different from FIG. 4 in the configurations of the intra-expansion-unit line setting units 31 and 31', intra-expansion-unit work-timing-clock generating unit 97, and intra-expansion-unit protection-timing-clock generating unit 97'.

In the drawing, the members having the same configuration are appended with a dash on the same numbers, and the descriptions thereof are omitted.

The reference clock received from the bus-interface unit 82 is synchronized with the internal clock input to the PLL circuit 166 as the reference clock.

The output signal from the PLL circuit 66 is input to a variable delay element 132 and a selection circuit 134.

The variable delay element 132 applies a predetermined delay to the reference clock, and input this to the selection circuit 134.

The selection circuit 134 selects one of the inputs according to a system request, and outputs this to the intra-expansion-unit work-timing-clock generating unit 97.

A phase detection circuit 135 of the intra-expansion-unit work-timing-clock generating unit 97 inputs the output of the selection circuits 134 and 134', and outputs a phase comparison result to a register 137.

The register 137 stores the phase comparison result.

A control device 139 reads the value of the register 137, and controls a control circuit 133 based on the result thereof.

The control circuit 133 controls the amount of retardation of the variable delay element 132 in accordance with the command of the control device 139.

The PLL circuit 66 controls the phase of an output pulse by changing control voltage in accordance with the command of the control device 139.

Further, the control device 139, in response to a system request, outputs a control signal to the main unit 100 side via the bus-interface units 82 and 80, and thus can control the bias voltage of the voltage-controlled oscillator of the PLL circuit 65 within the main unit 100.

The bias voltage of the voltage-controlled oscillators within the variable delay element 132 and the PLL circuit 65 can be controlled independently or in combination in accordance with a system request.

Thus, providing a control line in an element or circuit capable of controlling the reference clock from the control device 139 within the expansion unit enables the phase of the work reference clock or the protection reference clock to be adjusted at each unit.

As also described in the descriptions of FIG. 2 and FIG. 3, the work and protection line setting units 30 and 30', and the work and protection timing clock generating units 96 and 96' of the main unit 100 are each configured on a different circuit board, and are connected with the backboard wiring within the shelf The intra-expansion-unit line setting units 31 and 31', and the intra-expansion-unit work and protection timing clock generating units 97 and 97' of the expansion units 90 and 91 are each configured on a different circuit board, and are connected with the backboard within the shelf.

In addition, the control device 139 is also configured on an independent circuit board (unit), and is connected to the backboard wiring within the shelf of the expansion units 90 and 91.

Figure 14:
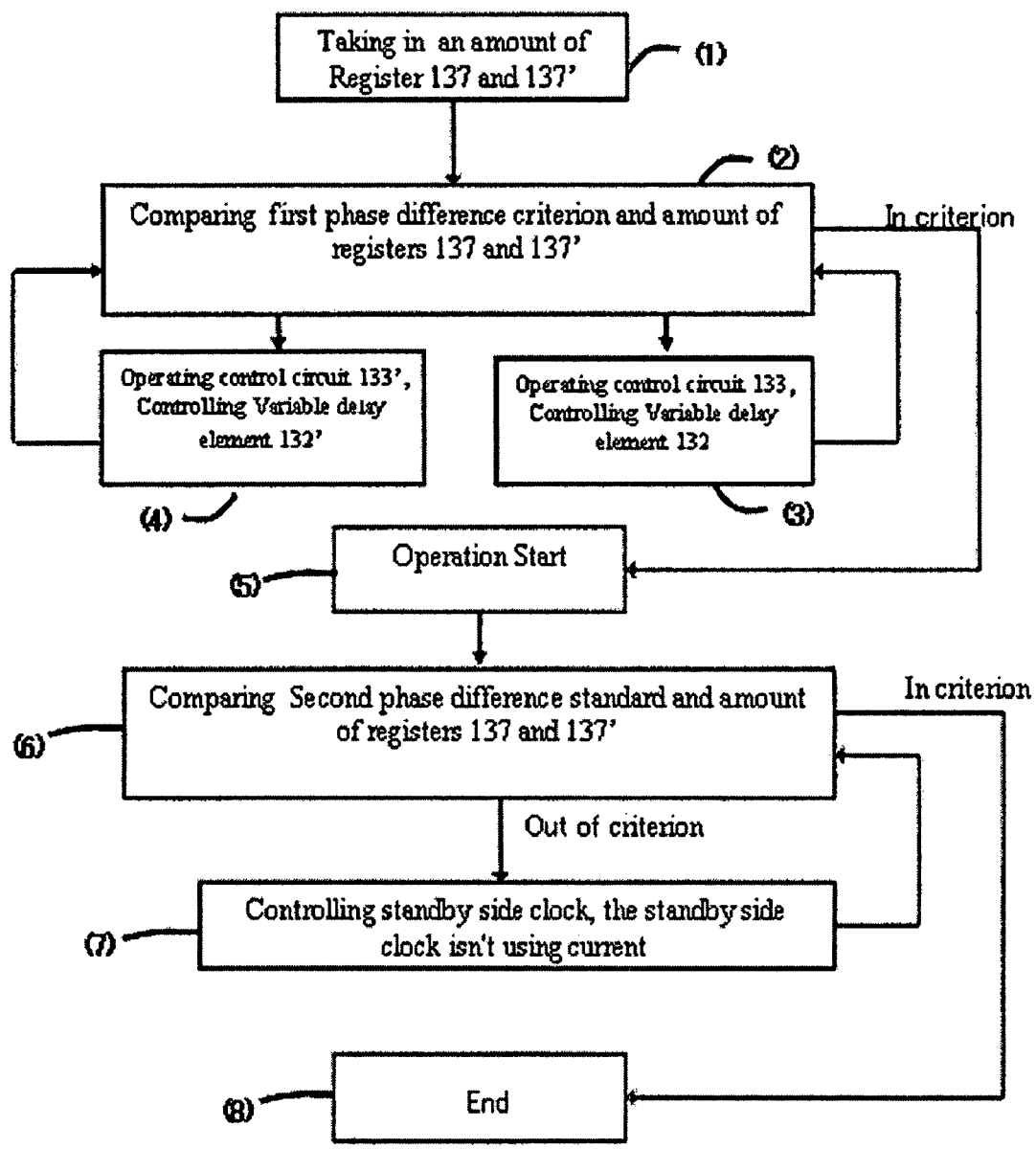
FIG. 14 is a diagram illustrating control of the third embodiment.

FIG. 14 is a diagram illustrating an example of the control flow of the control device 139 according to the third embodiment.

Control operation in the present flowchart is for describing control at the time of initial settings when starting up the system, and control in an operating state.

The descriptions of the respective blocks in the flowchart are shown below.
(1) Take in the values of the registers 137 and 137'.
(2) Compare a first phase difference criterion and the values of the registers 137 and 137'.

In the event that the phase difference width between the work reference clock and the protection reference clock is within a predetermined criterion, the flow proceeds to (5), or in the event that the phase difference width of the work reference clock as to the protection reference clock is greater than the criterion width, and the phase thereof is advanced, the flow proceeds to (3), or in the event that the phase difference width of the work reference clock as to the protection reference clock is greater than the criterion width, and the phase thereof is delayed, the flow proceeds to (4).
(3) Operate the control circuit 133 to control the variable delay element 132.
(4) Operate the control circuit 133' to control the variable delay element 132'.
(5) Start operation using the work reference clock.
(6) Verify a second phase difference criterion and the values of the registers 137 and 137'.

If the event is out of criterion, the flow proceeds to (7), otherwise the flow proceeds to (8).
(7) In the event out of criterion, control the PLL circuits 66 and 66' within the intra-expansion-unit line setting units 31 and 31', the PLL within the work clock unit 95, and the PLL within the protection clock unit 95' so as to control the clock on the standby side which is not in use as the work reference clock.
(8) In the event of within the criterion, end control.

According to the above operation, flexible phase synchronization can be performed between the clocks in the event of a state in which there is no relationship between operation when starting up the system and standby.

The above first through third embodiments can be appropriately combined as necessary.

According to an embodiment of the present invention, smooth phase correction can be performed by adjusting the amount of retardation of variable delay elements provided on the expansion-unit side as to each clock to be subjected to phase comparison.

Further, according to the embodiment of the present invention, feedback control is performed by subjecting the variable delay elements provided in the expansion unit to phase comparison using a phase comparator provided in the subsequent stage of the variable delay elements, so phase monitoring can be performed linearly including the phase shift caused by the amount of propagation delaying due to the solid-state irregularity and environmental conditions of the mounting parts which cannot be suppressed by fixed delay processing, and at the time of processing passage of the variable delay elements, so phase correction can be performed with high precision.

According to the embodiment of the present invention, phase correction can be performed with high precision only for the amount of multiplying since the precision (delay interval) of phase comparison and correction processing is determined by the number of multiplying and the division ratio matched therewith. Also, in the event that the phase detection result exceeds the window width, correction processing making into an in-phase state in an instant manner can be performed.

According to the embodiment of the present invention, phase comparison is performed at the final stage on the clock transmission route on the standby side serving as a phase-corrected object within the device, and the phase comparison information can be subjected to phase control using a phase correction facility positioned on the preceding stage of the phase comparison position.

Further, complex phase adjustment control combined with phase correction means provided in the expansion unit can be performed by performing intensive monitoring control at a control device within the expansion unit, and performing control of the control voltage of a PLL circuit mounted on the main unit or a PLL circuit provided within the expansion unit.

Also, flexible clock control can be performed at the time of power-on of the system by the control device provided within the expansion unit controlling clock pull-in means provided within the expansion unit, and controlling the control voltage of the PLL circuit provided within the expansion unit at the time of power-on of the system.

What is claimed is:
1. A transmitting apparatus, comprising:
 a first device including:
  a first clock source for generating a first clock, and
  a second clock source for generating a second clock; and
 a second device including:
  a first timing clock generator for pulling the first clock into the second clock, the first timing clock generator including;
   a first variable delay element for variably delaying the first clock;
   a second variable delay element for variably delaying the second clock;
   a first phase detection circuit for comparing the first clock and the second clock; and
   a first phase controller controlling a phase control amount of the first variable delay element and the second variable delay element by the use of a result of the first phase detection circuit; and a second timing clock generator for pulling the second clock into the first clock, the second timing clock generator including:
a third variable delay element for variably delaying the first clock;
a fourth variable delay element for variably delaying the second clock;
a second phase detection circuit for comparing the first clock and the second clock; and
a second phase controller controlling a phase control amount of the third variable delay element and the fourth variable delay element by the use of a result of the second phase detection circuit.

2. The transmitting apparatus of claim 1, wherein the first phase comparator and the second phase comparator include:
a first frequency divider for receiving the first clock and for dividing the first clock into ½ frequency;
a second frequency divider for receiving the second clock and for dividing the second clock into ½ frequency;
a first fixed delay circuit connecting with the first frequency divider, the first fixed delay circuit selectively applying a delay;
a second fixed delay circuit connecting with the second frequency divider, the second fixed delay circuit selectively applying a delay;
an exclusive circuit receiving outputs from the first fixed delay circuit and the second fixed delay circuit, the exclusive circuit taking exclusive-OR by the use of outputs of the first delay circuit and the second delay circuit;
an integration circuit for converting an output of the exclusive circuit into a voltage;
a first bias-voltage comparator comparing the voltage from the integration circuit with a first offset voltage so as to output a high signal in case that the voltage is greater than the first offset voltage; and
a second bias-voltage comparator comparing the voltage from the integration circuit with a second offset voltage so as to output a high signal in case that the voltage is smaller than the second offset voltage.

3. The transmitting apparatus of claim 2, wherein the first phase controller and the second phase controller include:
a phase difference correction determination circuit for receiving the high signals from the first bias-voltage comparator and the second bias-voltage comparator, the phase difference correction determination circuit outputting control flags in accordance with phase difference of the first clock and the second clock;
an up-down counter for receiving the control flags and outputting a value on the bases of the control flags from the phase difference correction determination circuit; and
a decoding circuit for detecting the value from the up-down counter and controlling the first variable delay element and the second variable delay element, or the third variable delay element and the fourth variable delay element.

4. A transmitting apparatus, comprising:
a first device including:
a first clock source for generating a first clock; and
a second clock source for generating a second clock; and
a second device including:
a first timing clock generator for pulling the first clock into the second clock, the first timing clock generator including:
a first PLL circuit for firstly multiplying the first clock;
a second PLL circuit for secondly multiplying the second clock;
a first phase adjustment for counting the firstly-multipled first clock and outputting a first counted result;
a second phase adjustment for counting the secondly-multiplied second clock and outputting a second counted result;
a first phase detection circuit for performing phase comparison based on the first counted result with the second counted result and outputting a first phase comparison result; and
a first phase control circuit for adjusting a timing for dividing of the firstly-multiplied first clock and the secondly-multiplied second clock at the first PLL circuit and the second PLL circuit; and
a second timing clock generator pulling the second clock into the first clock, the second timing clock generator including:
a third PLL circuit for thirdly multiplying the first clock;
a fourth PLL circuit for fourthly multiplying the second clock;
a third phase adjustment for counting the thirdly-multiplied first clock and outputting a third counted result;
a fourth phase adjustment for counting the fourthly-multiplied second clock and outputting a fourth counted result;
a second phase detection circuit for performing phase comparison based on the third counted result with the fourth counted result and outputting a
second phase comparison result; and a second phase control circuit for adjusting a timing for dividing of the thirdly-multiplied first clock and the fourthly-multiplied second clock at the first PLL circuit and the second PLL circuit.

5. A transmitting apparatus, comprising:
a first device including:
a first clock source for generating a first clock; and
a second clock source for generating a second clock; and
a second device including:
a first timing clock generator including:
a first PLL circuit for synchronizing an internal clock with the first clock and outputting a first reference clock, and
a first variable delay element for applying a delay to the first reference clock;
a second timing clock generator including:
a second PLL circuit for synchronizing an internal clock with the second clock and outputting a second reference clock, and
a second variable delay element for applying a delay to the second reference clock;
a first phase detection circuit for comparing the first reference clock with the second reference clock and outputting a first result;
a second phase detection circuit for comparing the first reference clock with the second reference clock and outputting a second result; and
a controller for controlling the first reference clock and the second reference clock at the first timing clock generator and the second timing clock generator on the bases of the first result of the first phase detection circuit and the second result of the second phase detection circuit.

* * * * *

UNITED STATES PATENT AND TRADEMARK OFFICE
CERTIFICATE OF CORRECTION

| | | |
|---|---|---|
| PATENT NO. | : 7,599,460 B2 | Page 1 of 1 |
| APPLICATION NO. | : 11/400337 | |
| DATED | : October 6, 2009 | |
| INVENTOR(S) | : Hiroyuki Matsuo et al. | |

It is certified that error appears in the above-identified patent and that said Letters Patent is hereby corrected as shown below:

Title Page, Item (30) should read as follows:

(30) Foreign Application Priority Data

Sep. 30, 2005   (JP) .............................2005-289129

Signed and Sealed this
Eleventh Day of September, 2012

David J. Kappos
*Director of the United States Patent and Trademark Office*